US 6,723,592 B2

(12) United States Patent
Shih

(10) Patent No.: US 6,723,592 B2
(45) Date of Patent: Apr. 20, 2004

(54) METHOD OF FABRICATING AN X-RAY DETECTOR ARRAY ELEMENT

(75) Inventor: Po-Sheng Shih, Hsinchu (TW)

(73) Assignee: Hannstar Display Corporation, Taipei (TW)

( * ) Notice: Subject to any disclaimer, the term of this patent is extended or adjusted under 35 U.S.C. 154(b) by 0 days.

(21) Appl. No.: 10/395,169

(22) Filed: Mar. 25, 2003

(65) Prior Publication Data

US 2004/0009625 A1 Jan. 15, 2004

(30) Foreign Application Priority Data

Jul. 12, 2002 (CN) .......................... 91115600 A

(51) Int. Cl.⁷ .................... H01L 21/336; H01L 21/8234
(52) U.S. Cl. ................... 438/197; 438/239; 438/309
(58) Field of Search .................... 438/98, 197, 235, 438/239, 309, 311, 381

(56) References Cited

U.S. PATENT DOCUMENTS 5,525,527 A * 6/1996 Tran ........................ 438/98
5,942,756 A * 8/1999 Tran ..................... 250/370.09

* cited by examiner

Primary Examiner—David Nhu
(74) Attorney, Agent, or Firm—Oblon, Spivak, McClelland, Maier & Neustadt, P.C.

(57) ABSTRACT

A method of fabricating an X-ray detector array element. The method decreases consumption of masks during photolithography. A first mask defines a gate line on a substrate. A second mask defines a semiconducting island on a gate insulation layer. A third mask defines a common line and a data line on the gate insulation layer, and source and drain electrodes are simultaneously formed on the semiconducting island, thereby obtaining a TFT structure. A fourth mask defines a first conductive layer on a planarization layer. A fifth mask defines first and second via holes penetrating the planarization layer. A sixth mask defines a third conductive layer, a fourth conductive layer, and a first opening.

20 Claims, 41 Drawing Sheets

US 6,723,592 B2

METHOD OF FABRICATING AN X-RAY DETECTOR ARRAY ELEMENT

BACKGROUND OF THE INVENTION

1. Field of the Invention

The present invention relates to a method of fabricating an image sensor. More particularly, the present invention relates to a method of fabricating an X-ray detector array including a plurality of pixels, each including a storage capacitor and a thin film transistor (TFT).

2. Description of the Background Art

Electronic matrix arrays find considerable application in X-ray image sensors. Such devices generally include X and Y (or row and column) address lines transversely and longitudinally spaced apart and across at an angle to one another, thereby forming a plurality of crossover points. Associated with each crossover point is an element (e.g. a pixel) to be selectively addressed. These elements in many instances are memory cells or pixels of an electronically adjustable memory array or X-ray imaging array.

Typically, at least one switching or isolation device such as a diode or thin film transistor (TFT) is associated with each array element or pixel. The isolation devices permit the individual pixels to be selectively addressed by the application of suitable potentials between respective pairs of the X and Y address lines. Thus, the TFTs and diodes act as switching elements for energizing or otherwise addressing corresponding memory cells or storage capacitors.

In FIG. 1, a background X-ray detector for capturing digital radiographic images is illustrated. The X-ray detector includes a plurality of pixels 3, each including a thin film transistor (TFT) 5 and a storage capacitor 7. The storage capacitor 7 in each pixel includes a charge collector electrode 4 that functions as a top plate of the storage capacitor, and a pixel electrode 11 that functions as a bottom electrode of the capacitor.

FIG. 2 is a top view of a background X-ray detector pixel. FIG. 2B is a sectional view taken along line C–C' of FIG. 2A. As shown in FIGS. 2A and 2B, each pixel of the background art includes a substrate 200, a gate electrode 205, a gate line 206, a first gate insulation layer 210, an a-Si layer 215, an α-Si (amorphous silicon) layer 215, an n+ α-Si layer 220, a common line 225, a source electrode 230, a drain electrode 235, a data line 240, a planarization layer 245, a first via hole 250, a second via hole 255, a bottom electrode (a pixel electrode) 260, a dielectric layer 265, and a top electrode (a charge collector electrode) 270. In addition, symbol Cs indicates a storage capacitor.

The method for fabricating the above X-ray detector includes seven steps of photolithography and etching. That is, the background method requires seven masks. The processing steps are concisely described as follows.

The first photolithography step defines the gate electrode 205 and the gate line 206.

The second photolithography step defines the α-Si layer 215 and the n+ α-Si layer 220 to obtain a semiconductor island structure.

The third photolithography step defines the common line 225, the source electrode 230, the drain electrode 235, and the data line 240.

The fourth photolithography step defines the first via hole 250.

The fifth photolithography step defines the bottom electrode (the pixel electrode) 260.

The sixth photolithography step defines the second via hole 255.

The seventh photolithography step defines the top electrode (the charge collector electrode) 270.

SUMMARY OF THE INVENTION

The inventors of the present invention have recognized that to decrease manufacturing costs, a method that requires utilizing fewer masks than in the background method would be beneficial.

Thereby, an object of the present invention is to provide a novel method of fabricating an X-ray detector array element.

Another object of the present invention is to provide a novel method of fabricating an X-ray detector array element, requiring only six masks during photolithography.

In order to achieve these objects, the present invention provides a novel method of fabricating an X-ray detector array element. A substrate having a capacitor area and a transistor area is provided. A transversely extending gate line is formed on the substrate, wherein the gate line includes a gate electrode in the transistor area. A gate insulation layer is formed on the gate line, the gate electrode, and the substrate. A semiconducting island is formed on the gate insulation layer in the transistor area. A longitudinally extending common line and a longitudinally extending data line are formed on the gate insulation layer, and simultaneously, a source electrode and a drain electrode are formed on the semiconducting island to form a thin film transistor (TFT) structure, wherein the drain electrode electrically connects to the data line. A planarization layer is formed on the gate insulation layer, the common line, the TFT structure, the data line, and the gate line. A first conductive layer is formed on the planarization layer in the capacitor area. A dielectric layer is formed on the first conductive layer and the planarization layer. A first via hole and a second via hole penetrating the dielectric layer and the planarization layer are formed, wherein the first via hole exposes the surface of the source electrode, and the second via hole exposes part of the surface of the first conductive layer and part of the surface of the common line. A conformal second conductive layer is formed on the dielectric layer, the interior surrounding surface of the first via hole, and the interior surrounding surface of the first via hole. Part of the second conductive layer is removed to form a third conductive layer, a fourth conductive layer, and a first opening. The third conductive layer is isolated from the fourth conductive layer by the first opening, the third conductive layer electrically connects to the source electrode, and the first conductive layer electrically connects to the common line by the fourth conductive layer. Thus, a storage capacitor structure composed of the first conductive layer, the dielectric layer, and the third conductive layer in the capacitor area is obtained.

The present invention also provides another method of fabricating an X-ray detector array element. A substrate having a capacitor area and a transistor area is provided. A transversely extending gate line is formed on the substrate, wherein the gate line includes a gate electrode in the transistor area. A gate insulation layer is formed on the gate line, the gate electrode, and the substrate. A semiconducting island is formed on the gate insulation layer in the transistor area. A longitudinally extending common line and a longitudinally extending data line are formed on the gate insulation layer, and simultaneously, a source electrode and a drain electrode are formed on the semiconducting island to form a thin film transistor (TFT) structure, wherein the drain electrode electrically connects the data line. A planarization layer is formed on the gate insulation layer, the common line, the TFT structure, the data line, and the gate line. A first conductive layer having a first opening is formed on the planarization layer in the capacitor area, wherein the first opening exposes the planarization layer above the common line. A dielectric layer is formed on the first conductive layer and the planarization layer. A first via hole and a second via hole penetrating the dielectric layer and the planarization layer are formed. The first via hole exposes the surface of the source electrode, the second via hole exposes part of the surface of the first conductive layer and part of the surface of the common line, and the second via hole and the first opening overlap. A conformal second conductive layer is formed on the dielectric layer, the interior surrounding surface of the first via hole, and the interior surrounding surface of the second via hole. Part of the second conductive layer is removed to form a third conductive layer, a fourth conductive layer, and a second opening. The third conductive layer is isolated from the fourth conductive layer by the second opening, the third conductive layer electrically connects to the source electrode, and the first conductive layer electrically connects to the common line by the fourth conductive layer. Thus, a storage capacitor structure composed of the first conductive layer, the dielectric layer, and the third conductive layer in the capacitor area is obtained.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIGS. 3A–8A are perspective top views of an X-ray detector array element according to the first embodiment of the present invention;

FIGS. 3B–8B are sectional views taken along line c–c' of FIGS. 3A–8A;

FIGS. 3C–8C are sectional views taken along line d–d' of FIGS. 3A–8A;

FIGS. 9A–14A are perspective top views of an X-ray detector array element according to the second embodiment of the present invention;

FIGS. 9B–14B are sectional views taken along line c–c' of FIGS. 9A–14A; and

FIGS. 9C–14C are sectional views taken along line e–e' of FIGS. 9A–14A.

DETAILED DESCRIPTION OF THE PREFERRED EMBODIMENTS

First Embodiment

FIGS. 3A–8A are perspective top views of an X-ray detector ray element according to the first embodiment of the present invention. FIGS. 3B–8B are sectional views taken along line c–c' of FIGS. 3A–8A. FIGS. 3C–8C are sectional views taken along line d–d' of FIGS. 3A–8A. In order to simplify the illustration, the accompanying drawings show a substrate in only one sample pixel region. That is, although only one pixel region is shown, the actual number of pixel regions may be very large.

Figure 1:
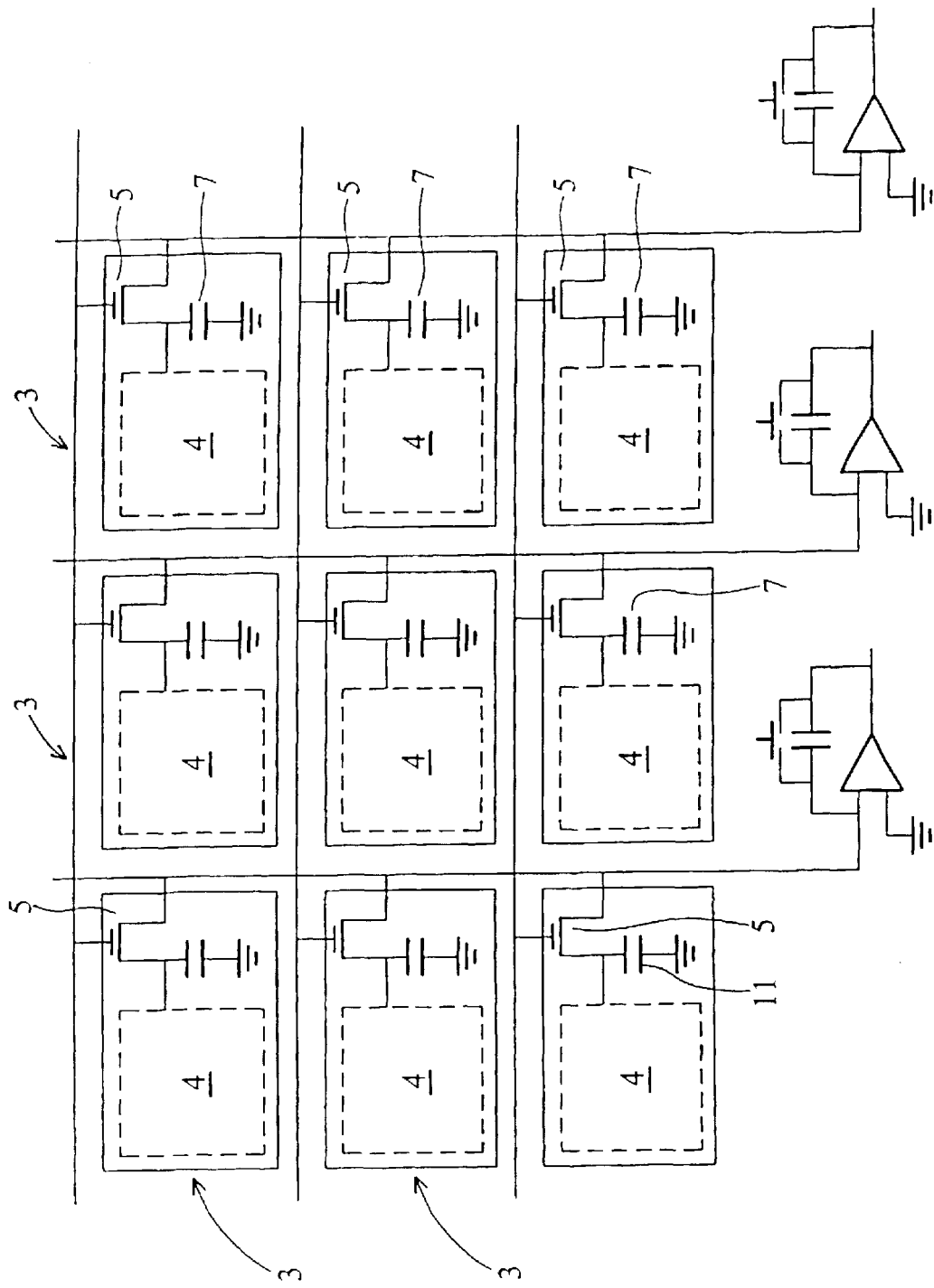
FIG. 1 is a schematic of a background art imager array in which each pixel includes a TFT and a storage capacitor.
Figure 2A:
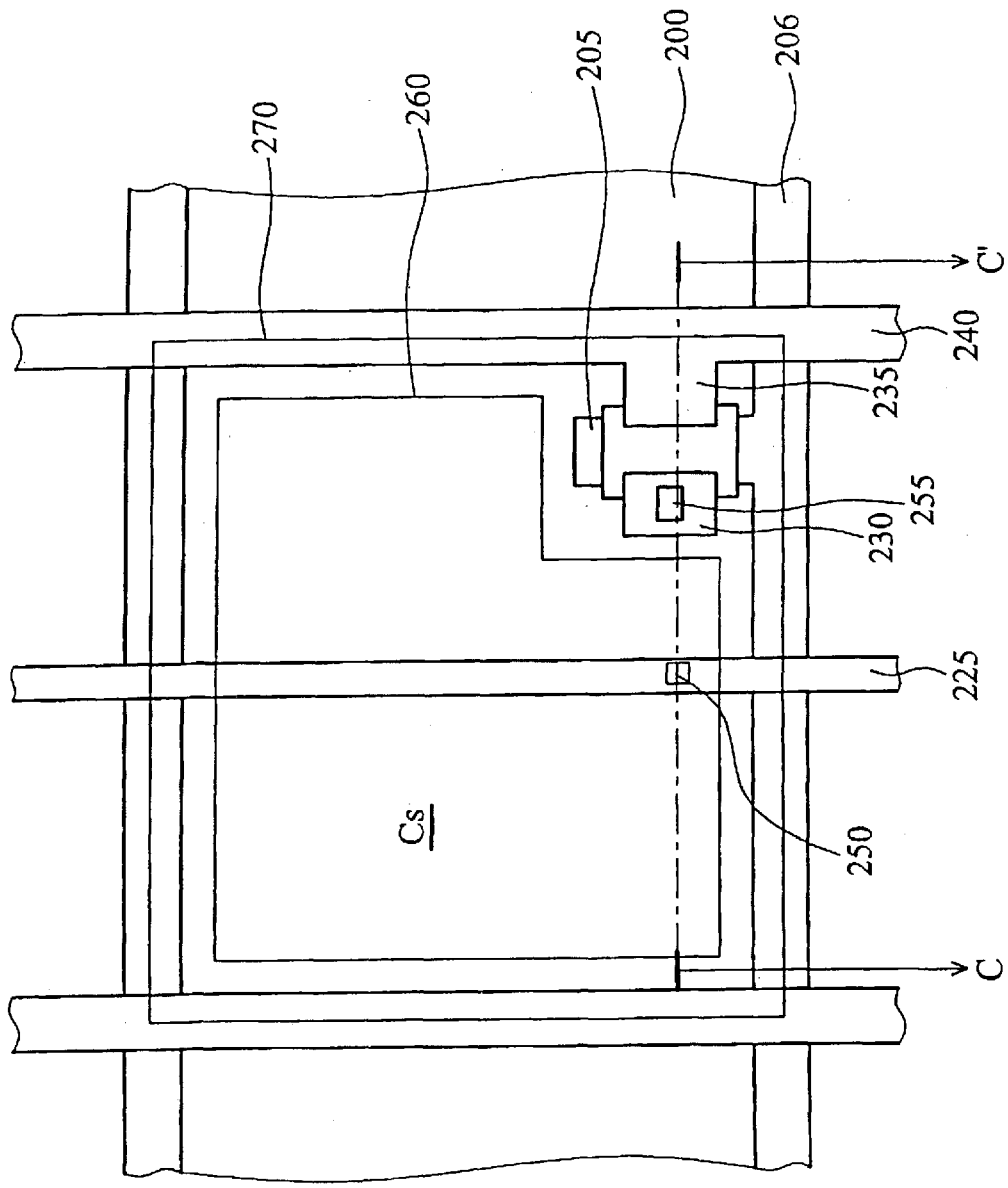
FIG. 2A is a perspective top view of an X-ray detector pixel of the background art.
Figure 2B:
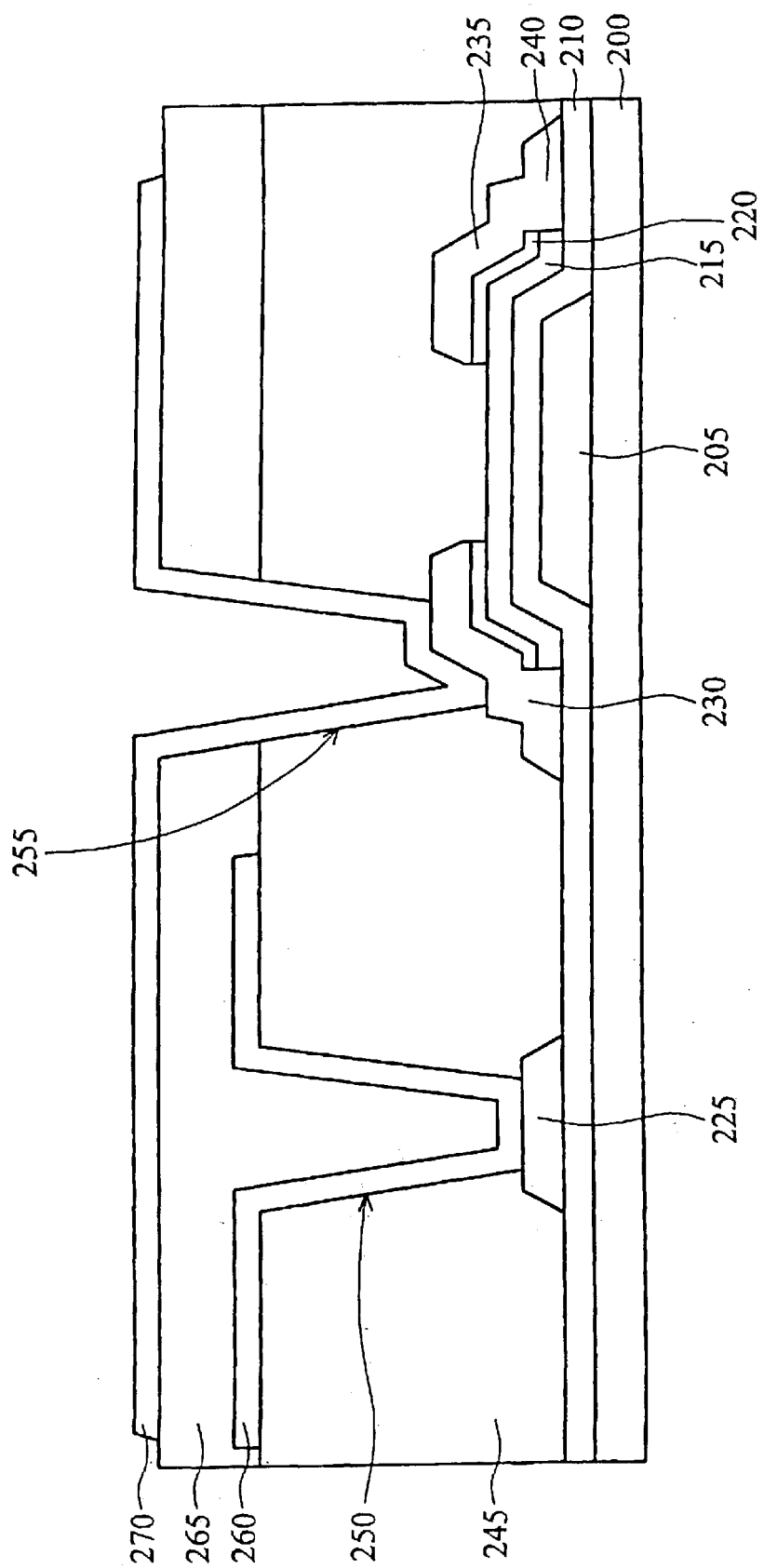
FIG. 2B is a sectional view taken along line C–C' of FIG. 2A.
Figure 3A:
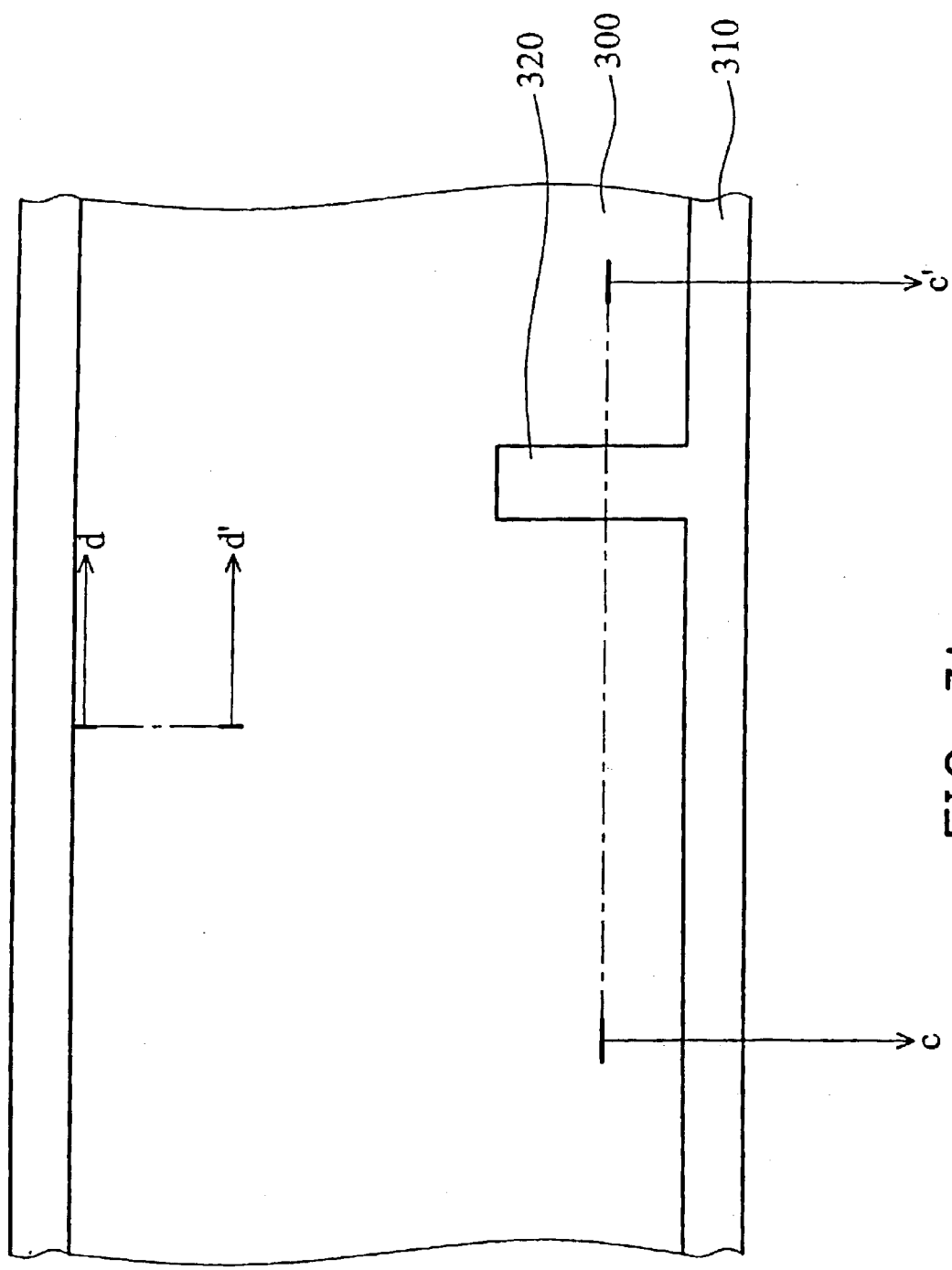
Figure 3B:
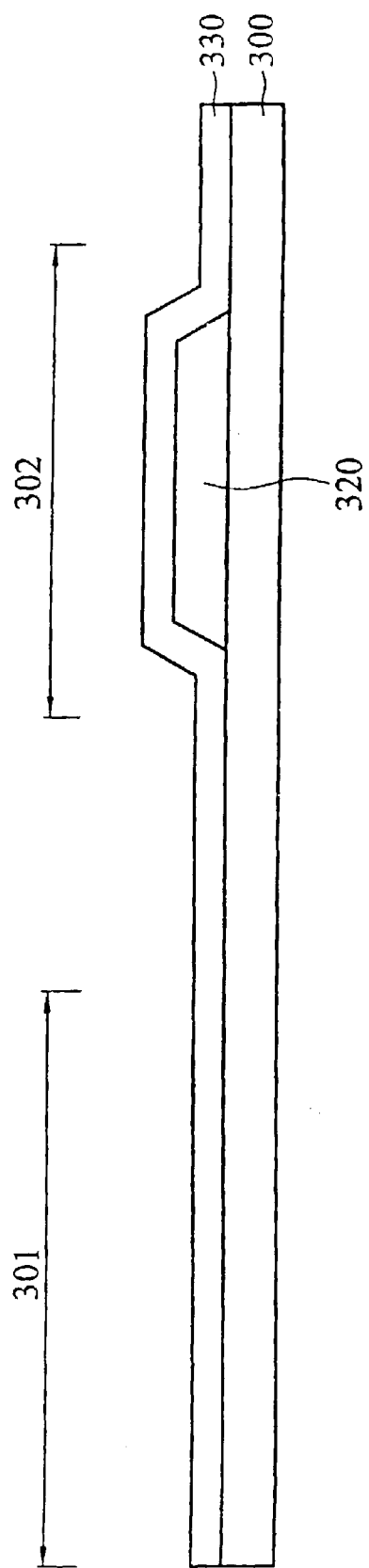
Figure 3C:
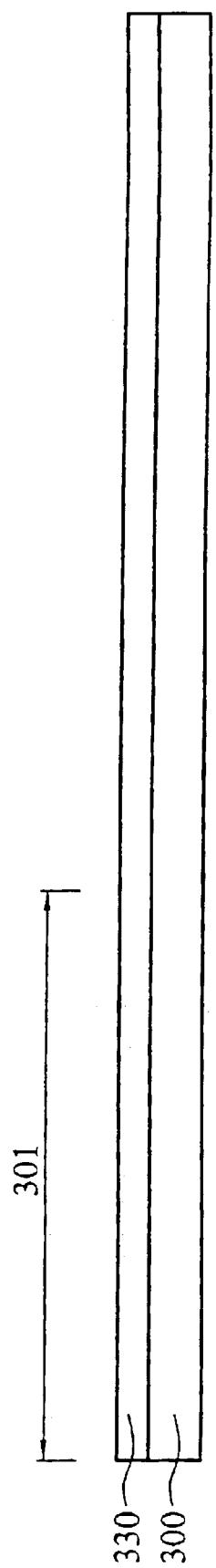

In FIGS. 3A, 3B, and 3C, a substrate 300, such as a glass substrate, having a capacitor area 301 and a transistor area 302 is provided. Then, deposition and a first photolithography procedure using a first mask (also referred to as a first photo engraving process, PEP I) are performed, and a transversely extending gate line 310 is formed on the substrate 300. The gate line 310 includes a gate electrode 320 in the transistor area 302.

It should be noted that FIG. 3A shows the gate line 310 having a protruding portion 320 in the transistor area 302, serving as the gate electrode 320. Nevertheless, the present invention is not intended to limit the position of the gate electrode. For example, the gate line 310 located in the transistor area 302 can also serve as the gate electrode 320, as shown in FIGS. 8D and 8E. The illustration of the FIGS. 8D and 8E will be described as a modification of the first embodiment.

In FIGS. 3A, 3B, and 3C, a gate insulation layer 330 is formed on the gate line 310, the gate electrode 320, and the substrate 300. The gate line 310 and the gate electrode 320 may be metal formed by deposition. The gate insulation layer 330 maybe $SiO_2$, $SiN_x$, or SiON formed by deposition.

Figure 4A:
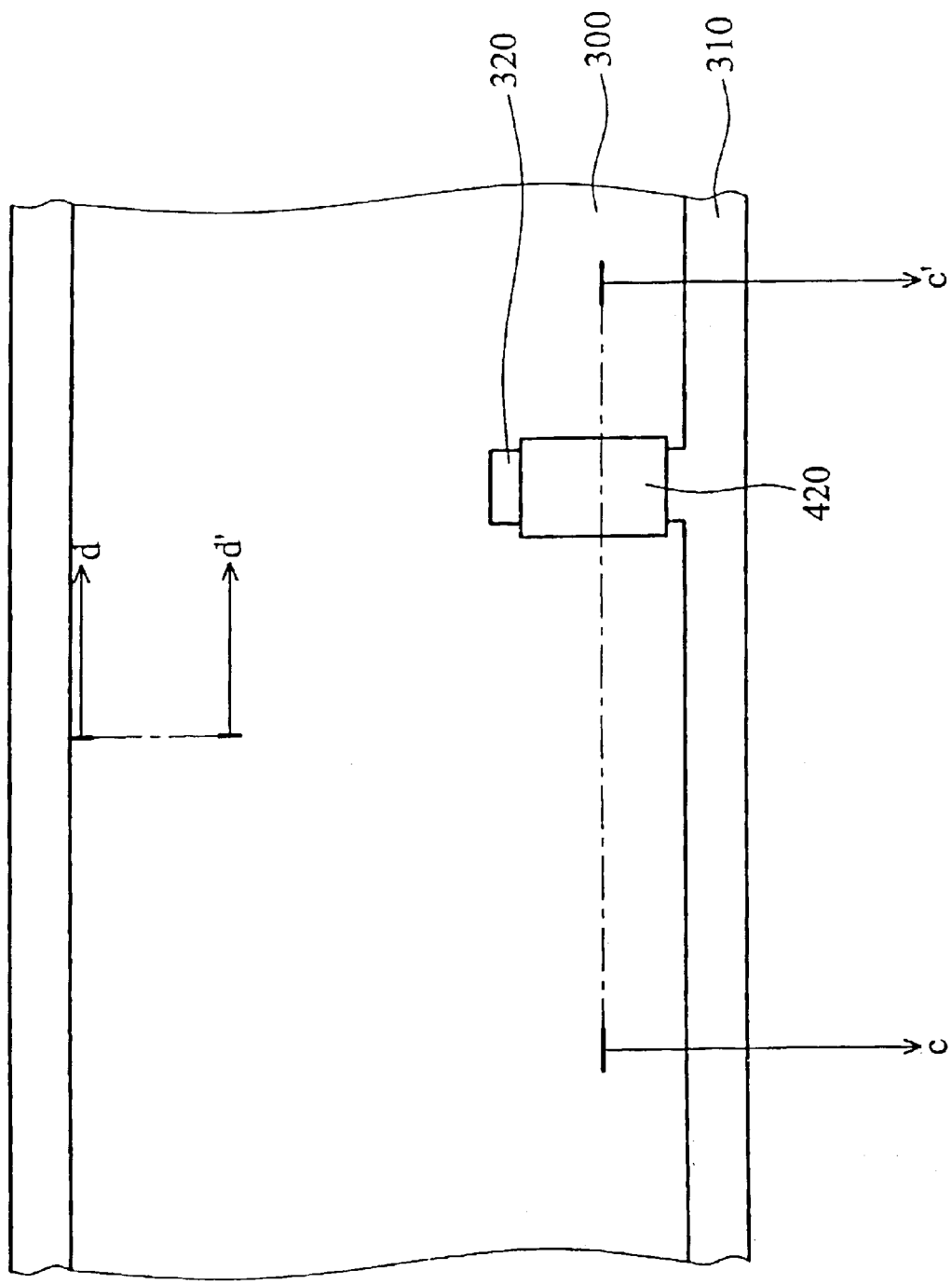
Figure 4B:
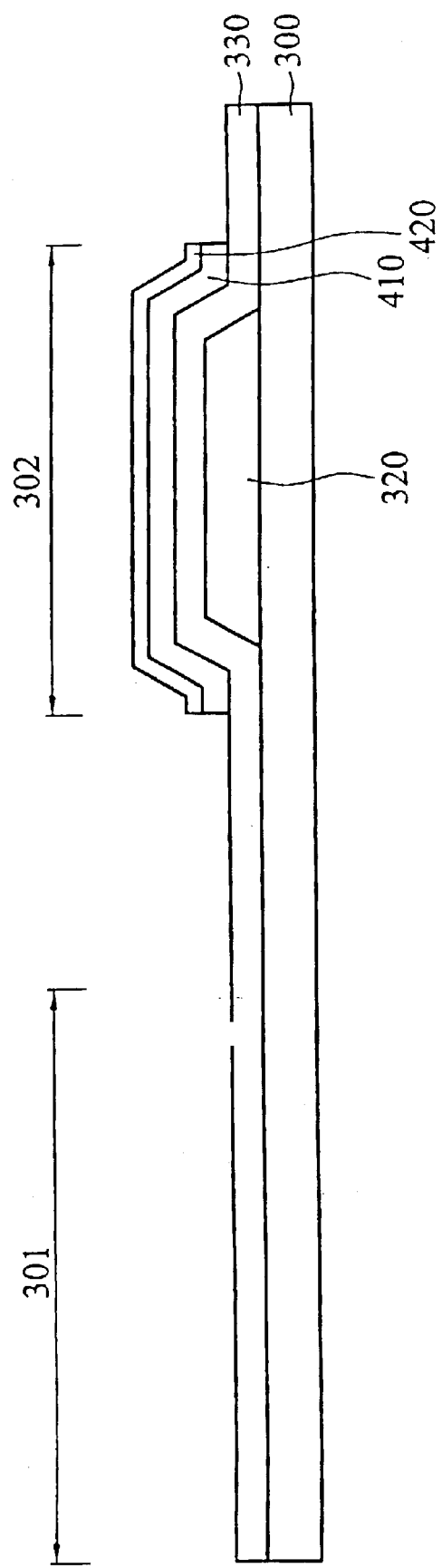
Figure 4C:
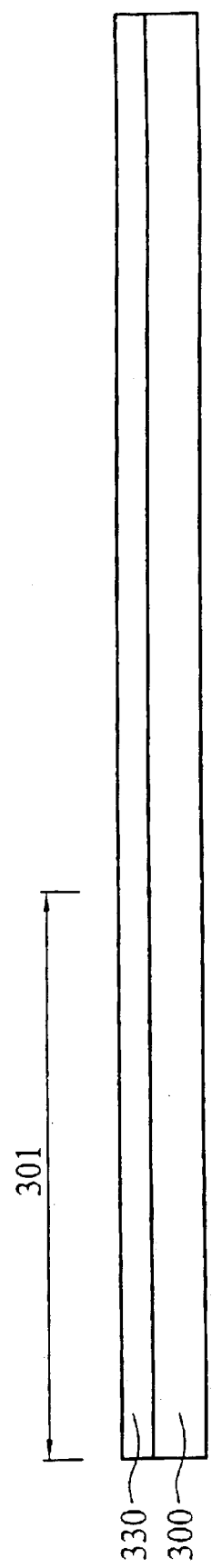

In FIGS. 4A, 4B, and 4C, an amorphous silicon layer ($\alpha$-Si layer, not shown) is deposited on the gate insulation layer 330, and then a doped amorphous silicon layer (e.g. $n^+$ $\alpha$-Si, not shown) is deposited on the amorphous silicon layer. Next, a second photolithography procedure using a second mask (PEP II) is performed, and part of the doped amorphous silicon layer and the amorphous silicon layer are etched to form a semiconducting island on the gate insulation layer 330 in the transistor area 302. The semiconducting island is composed of a patterned amorphous silicon layer 410 and a patterned doped amorphous silicon layer 420.

Figure 5A:
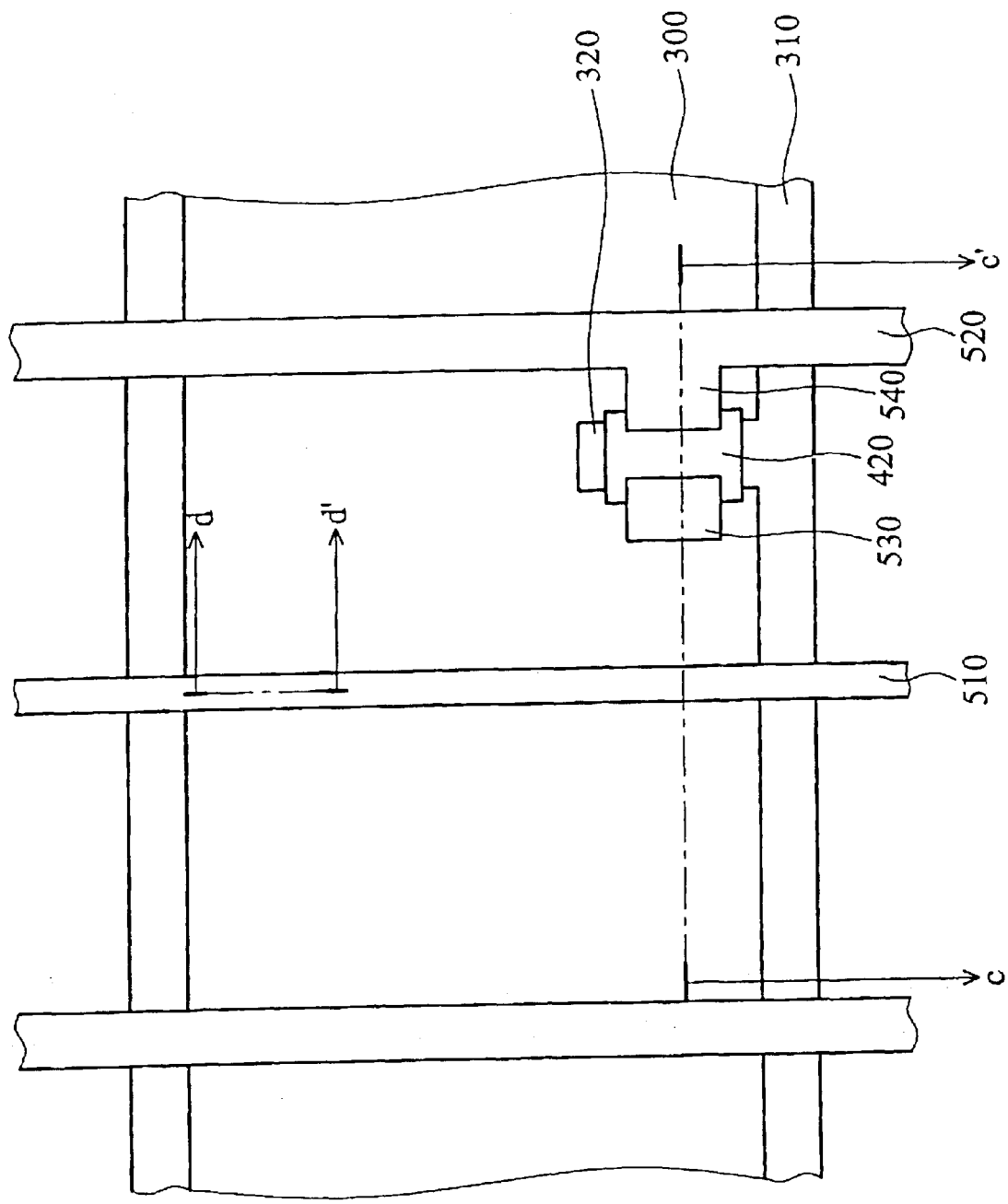
Figure 5B:
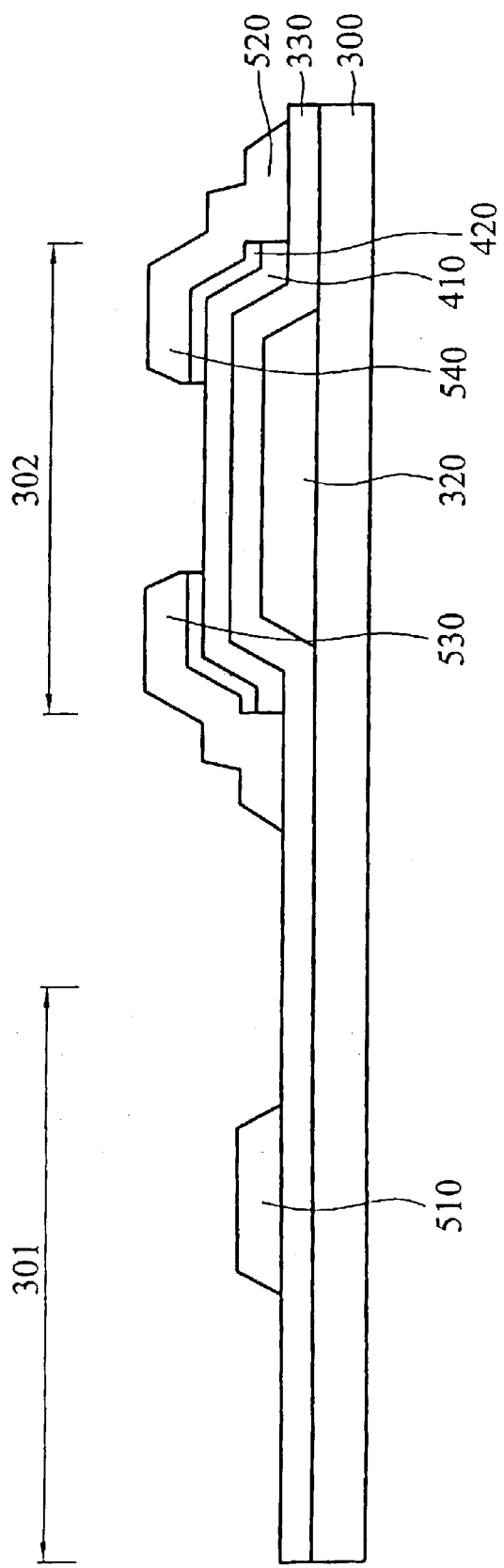
Figure 5C:
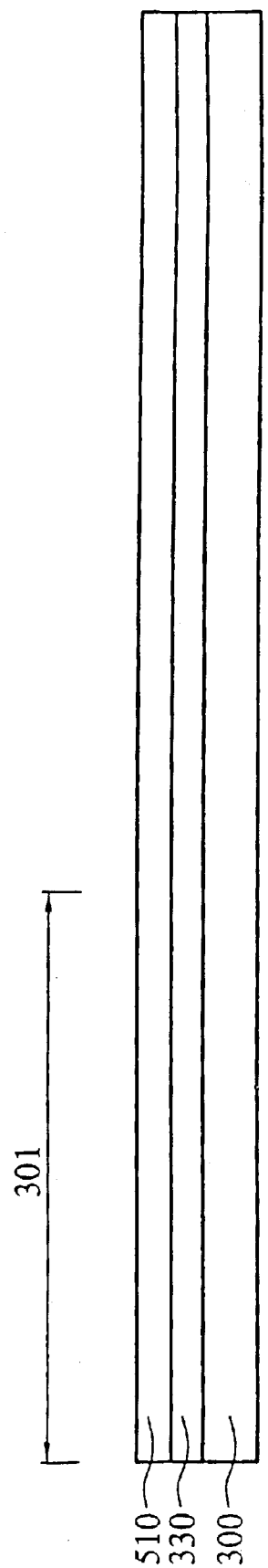

In FIGS. 5A, 5B, and 5C, a conductive layer (not shown) is deposited on the gate insulation layer 330 and the semiconducting island. Then, a third photolithography procedure using a third mask (PEP III) is performed to remove part of the conductive layer (not shown), and a longitudinally extending common line 510 and a longitudinally extending data line 520 are formed on the gate insulation layer 330, and simultaneously, a source electrode 530 and a drain electrode 540 are formed on the doped amorphous silicon layer 420. Then, using the source electrode 530 and the drain electrode 540 as a mask, part of the doped amorphous silicon layer 420 is etched to expose part of the surface of the amorphous silicon layer 410. Thus, a thin film transistor (TFT) structure is obtained in the transistor area 302. Also, the drain electrode 540 electrically connects to the data line 520.

Figure 6A:
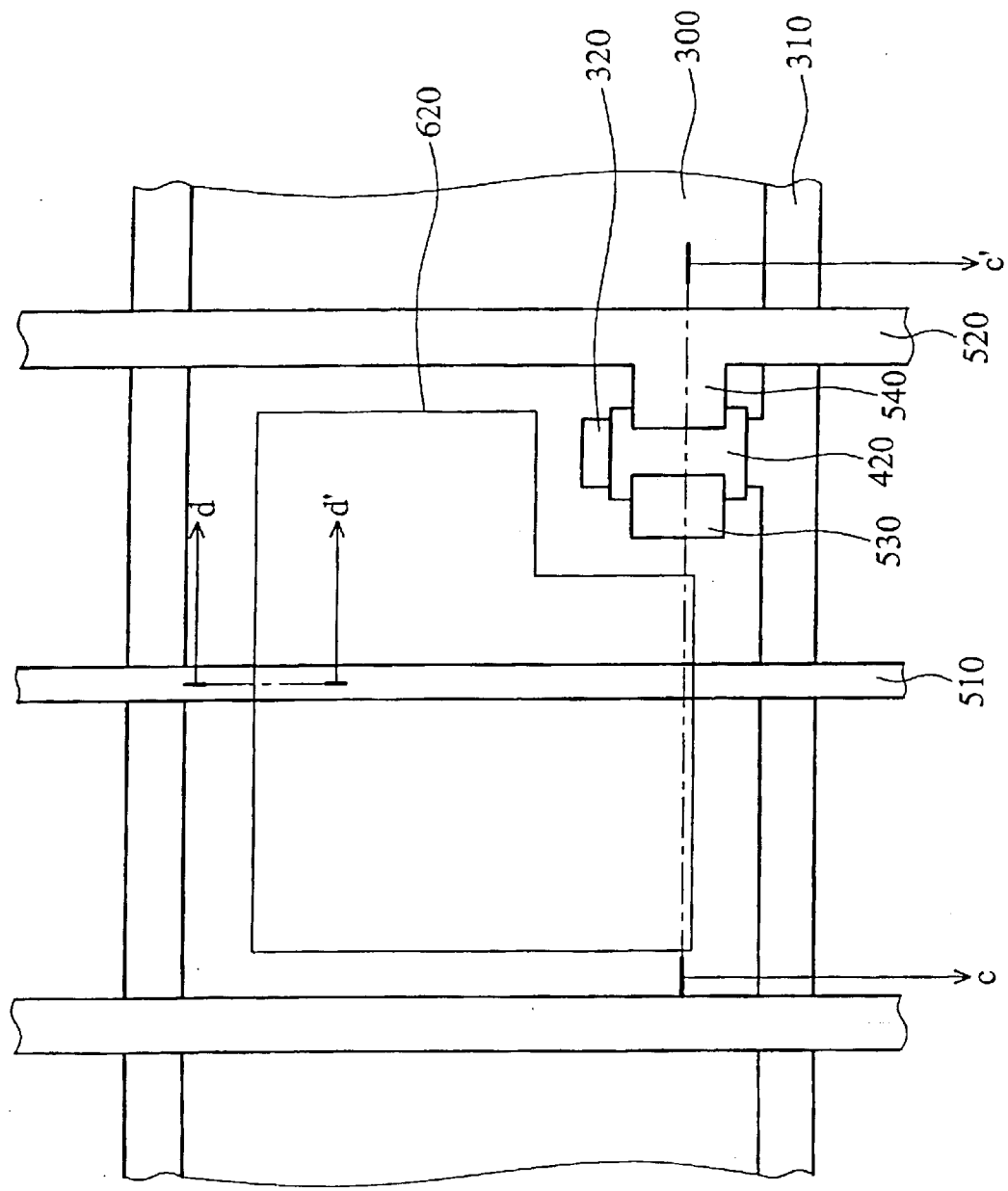
Figure 6B:
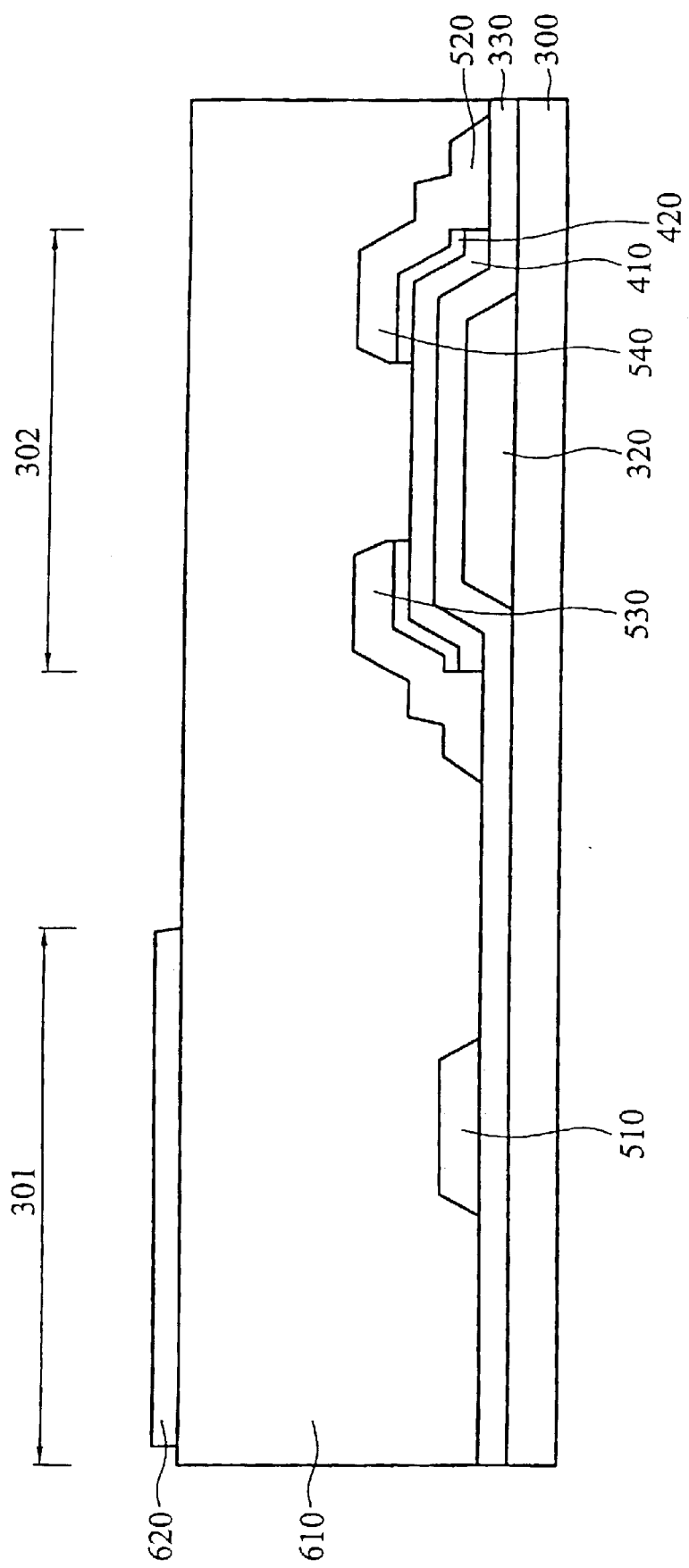
Figure 6C:
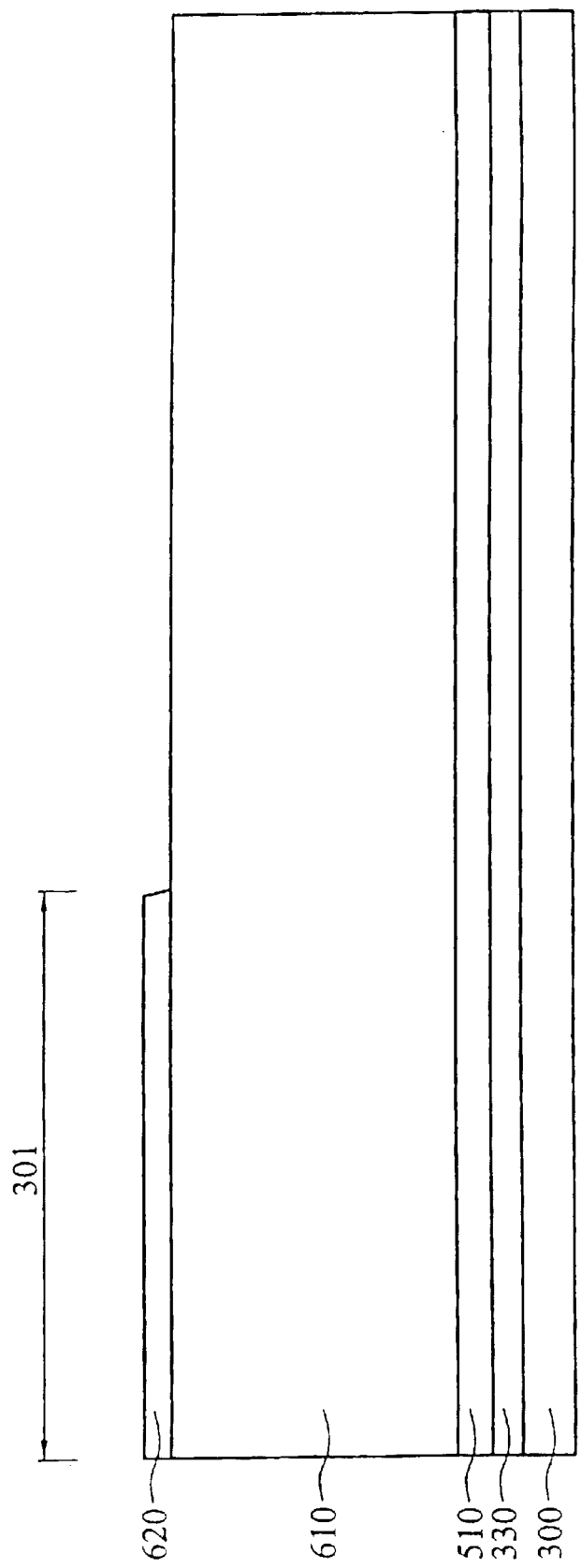

In FIGS. 6A, 6B, and 6C, a planarization layer 610 is formed on the gate insulation layer 330, the common line 510, the TFT structure, the data line 520, and the gate line 310. The planarization layer 610 may be a spin-on-glass (SOG) or organic layer formed by spin coating. Then, deposition and a fourth photolithography procedure using a fifth mask (PEP IV) are performed, and a first conductive layer 620 is formed on the planarization layer 610 in the capacitor area 301. The first conductive layer 620 may be indium tin oxide (ITO) or indium zinc oxide (IZO) formed by deposition, serving as a bottom electrode or a pixel electrode.

Figure 7A:
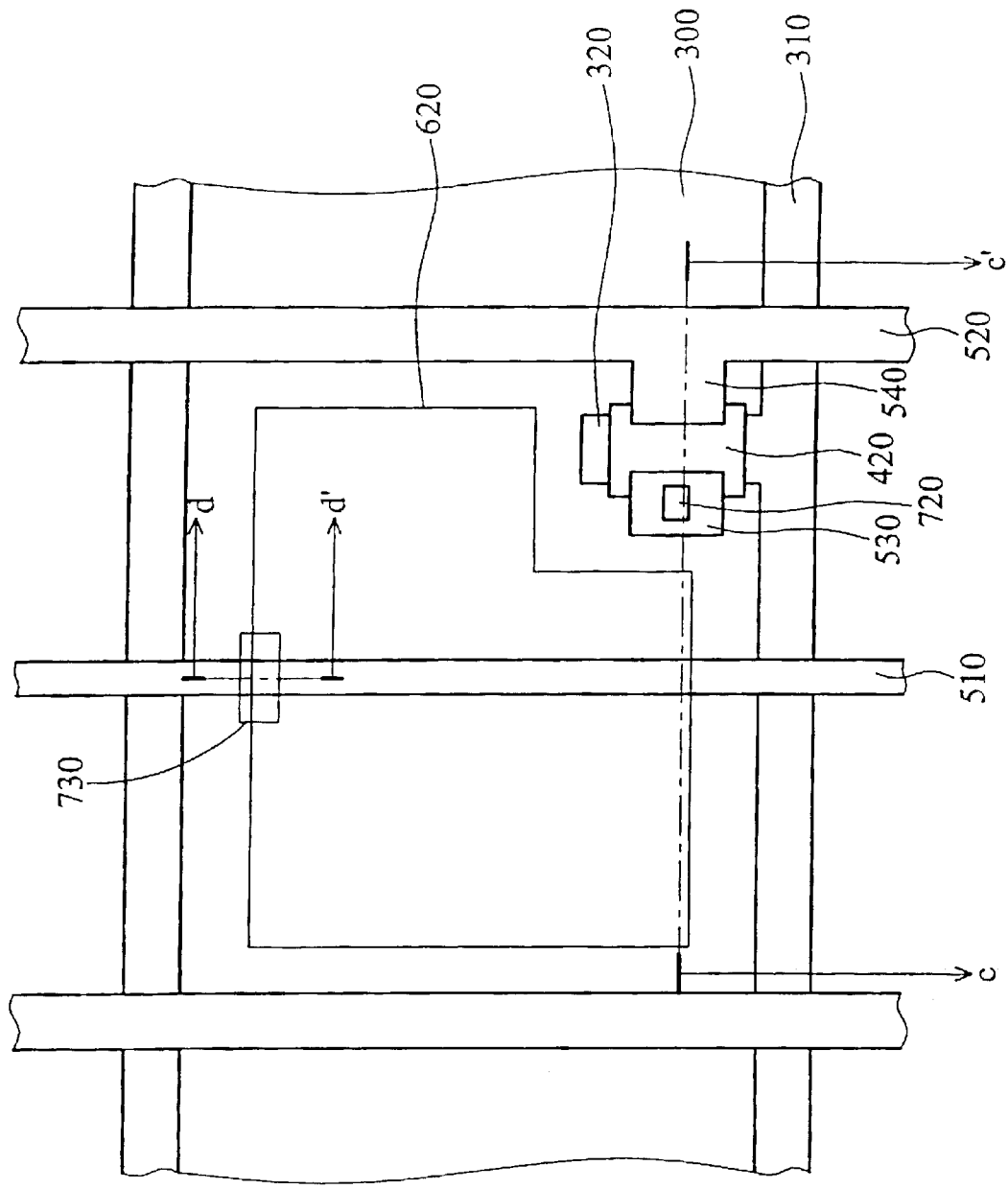
Figure 7B:
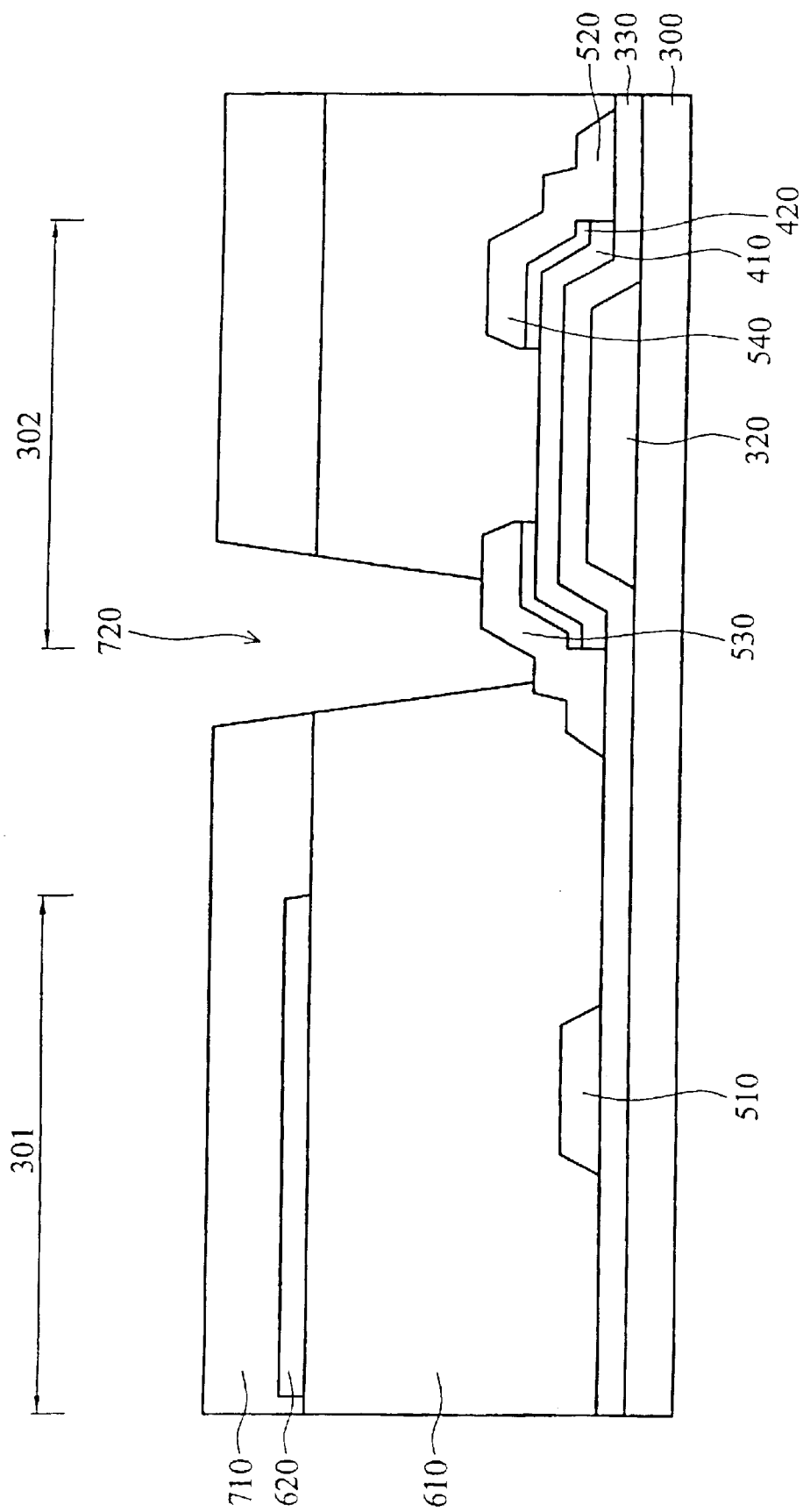
Figure 7C:
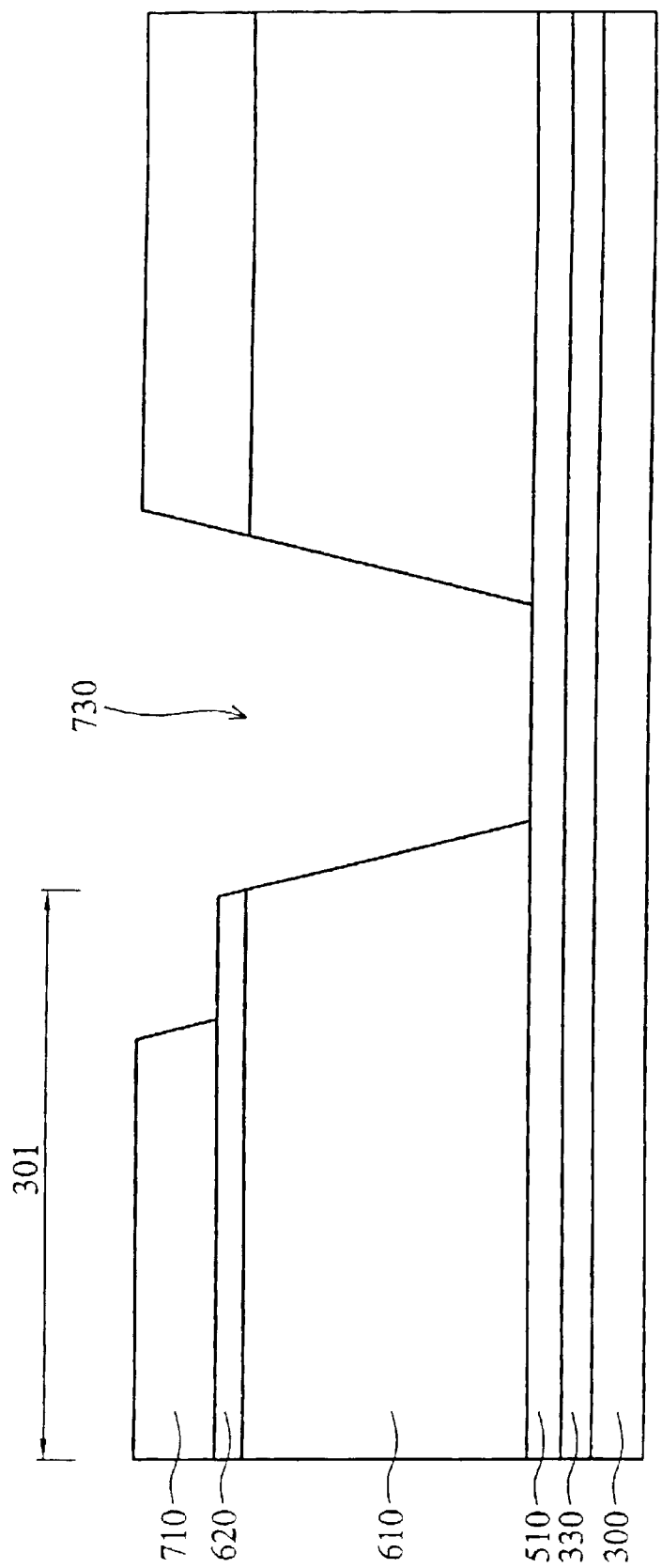

In FIGS. 7A, 7B, and 7C, a dielectric layer 710 is formed on the first conductive layer 620 and the planarization layer

610. The dielectric layer 710 can be $SiN_x$, SiON, or $SiO_x$ formed by deposition, serving as a dielectric layer of a capacitor. Then, a fifth photolithography procedure using a fifth mask (PEP V) is performed, and a first via hole 720 and a second via hole 730 penetrating the dielectric layer 710 and the planarization layer 610 are formed. The first via 720 exposes the surface of the source electrode 530, and the second via 730 exposes part of the surface of the first conductive layer 620 and part of the surface of the common line 510.

Figure 8A:
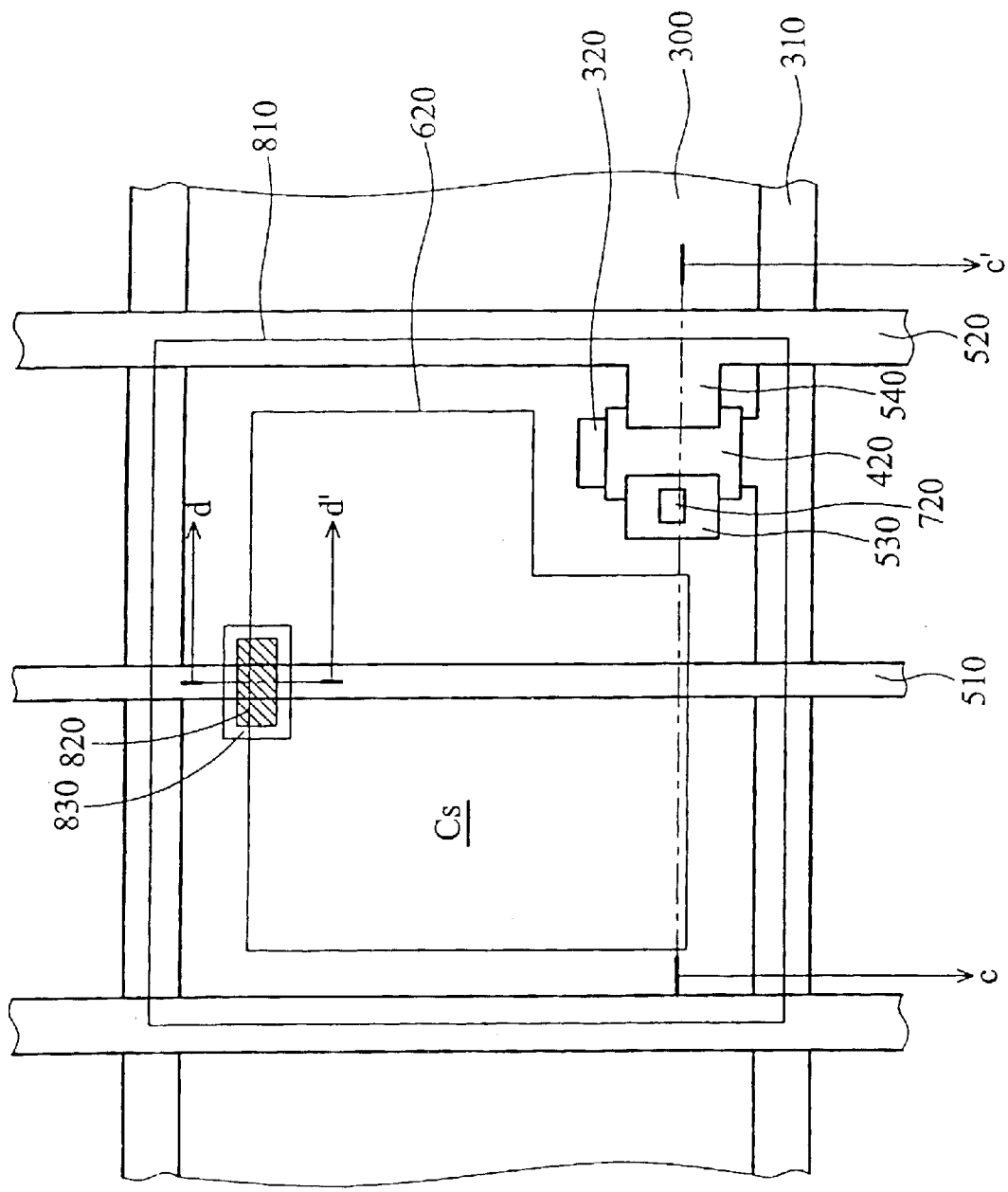
Figure 8B:
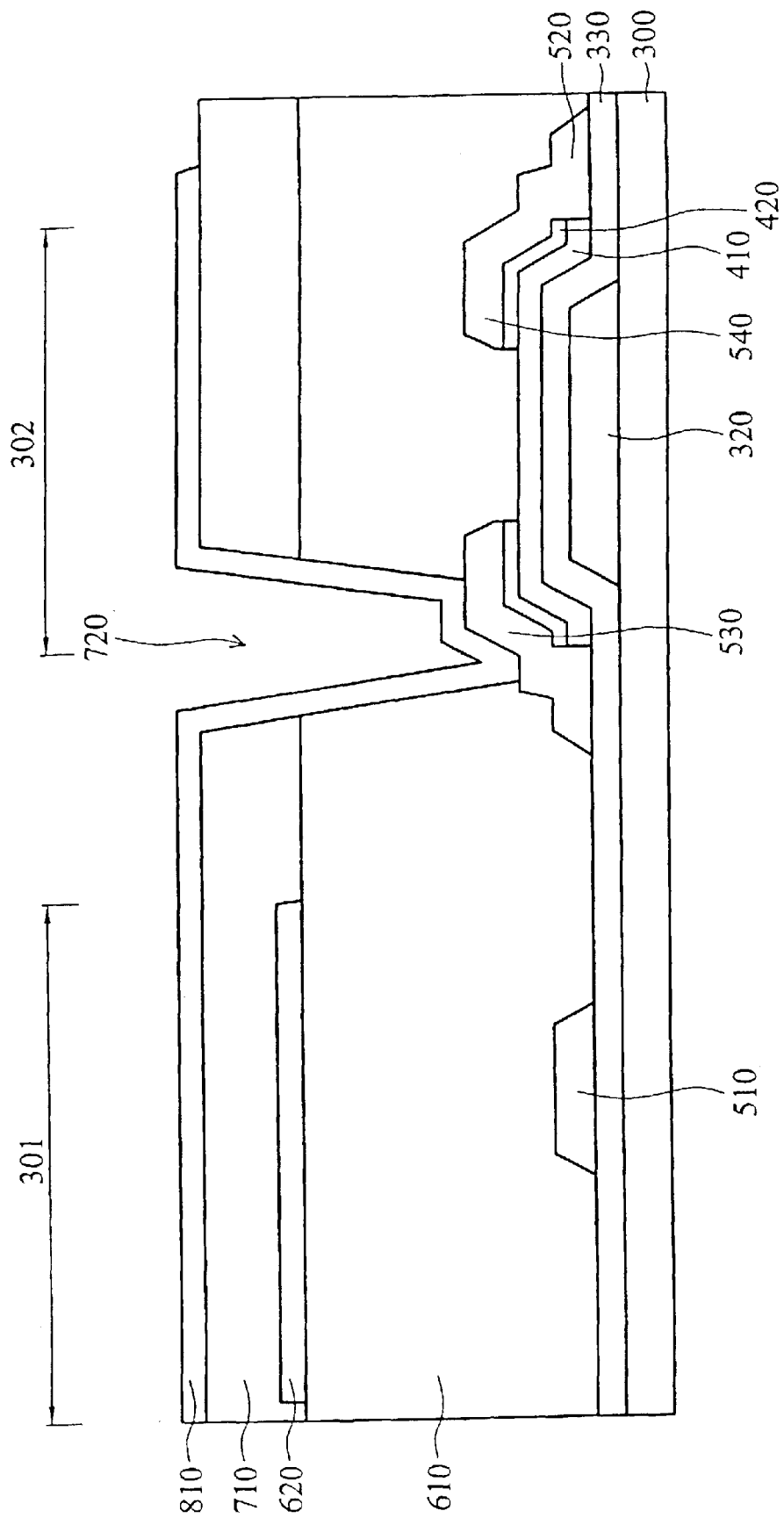
Figure 8C:
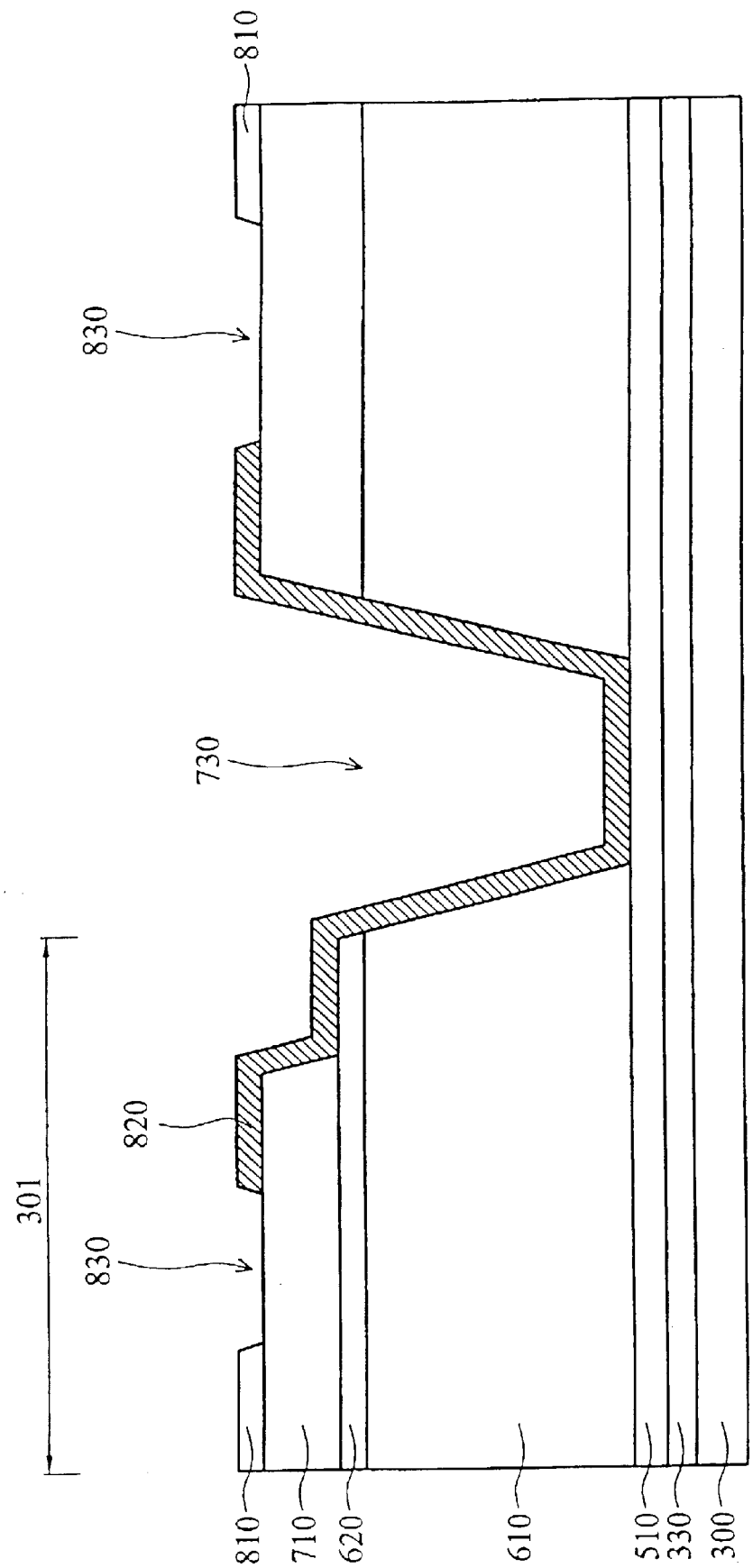
Figure 8D:
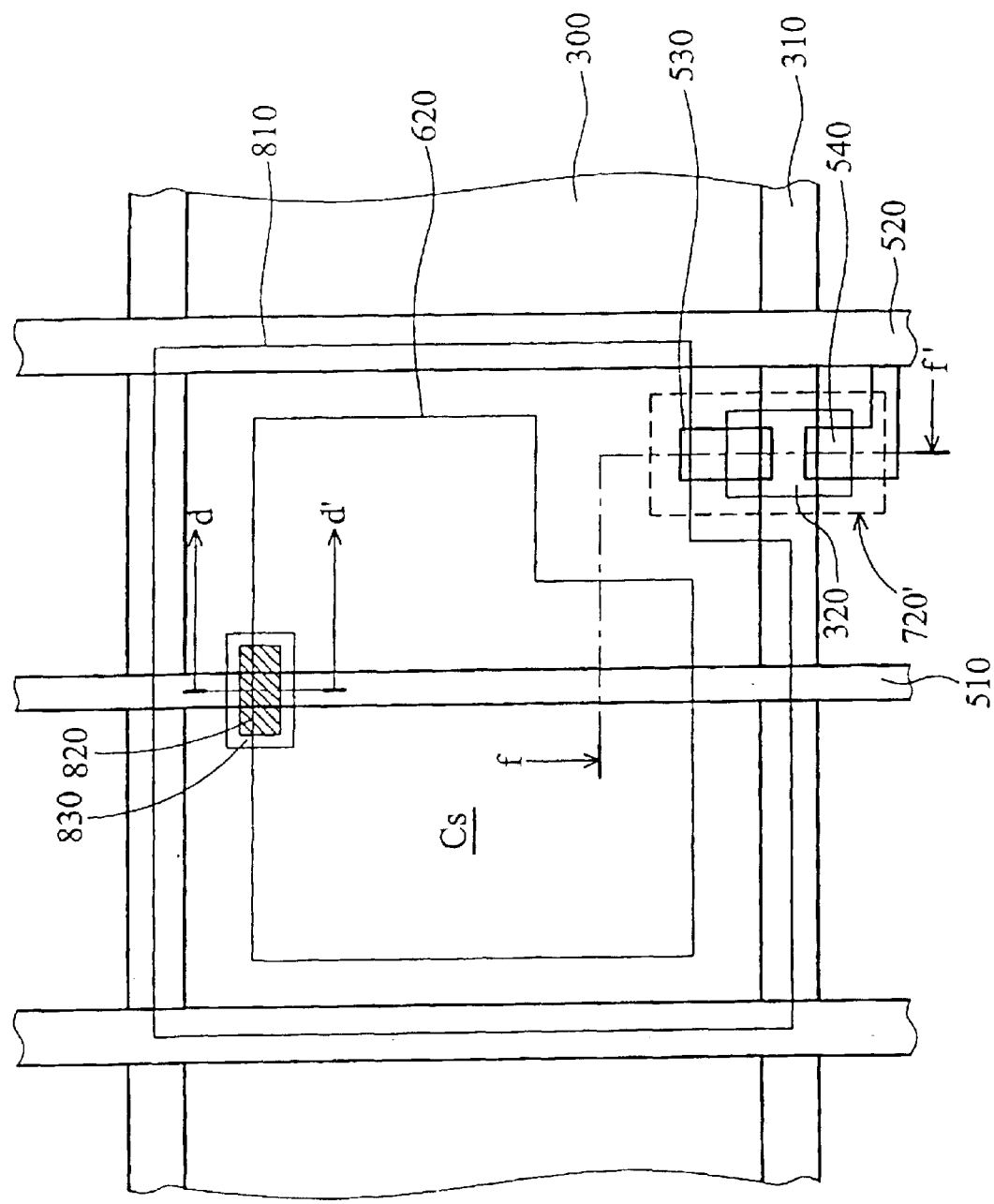
FIG. 8D is a perspective top view, according to a modification of the first embodiment of the present invention.
Figure 8E:
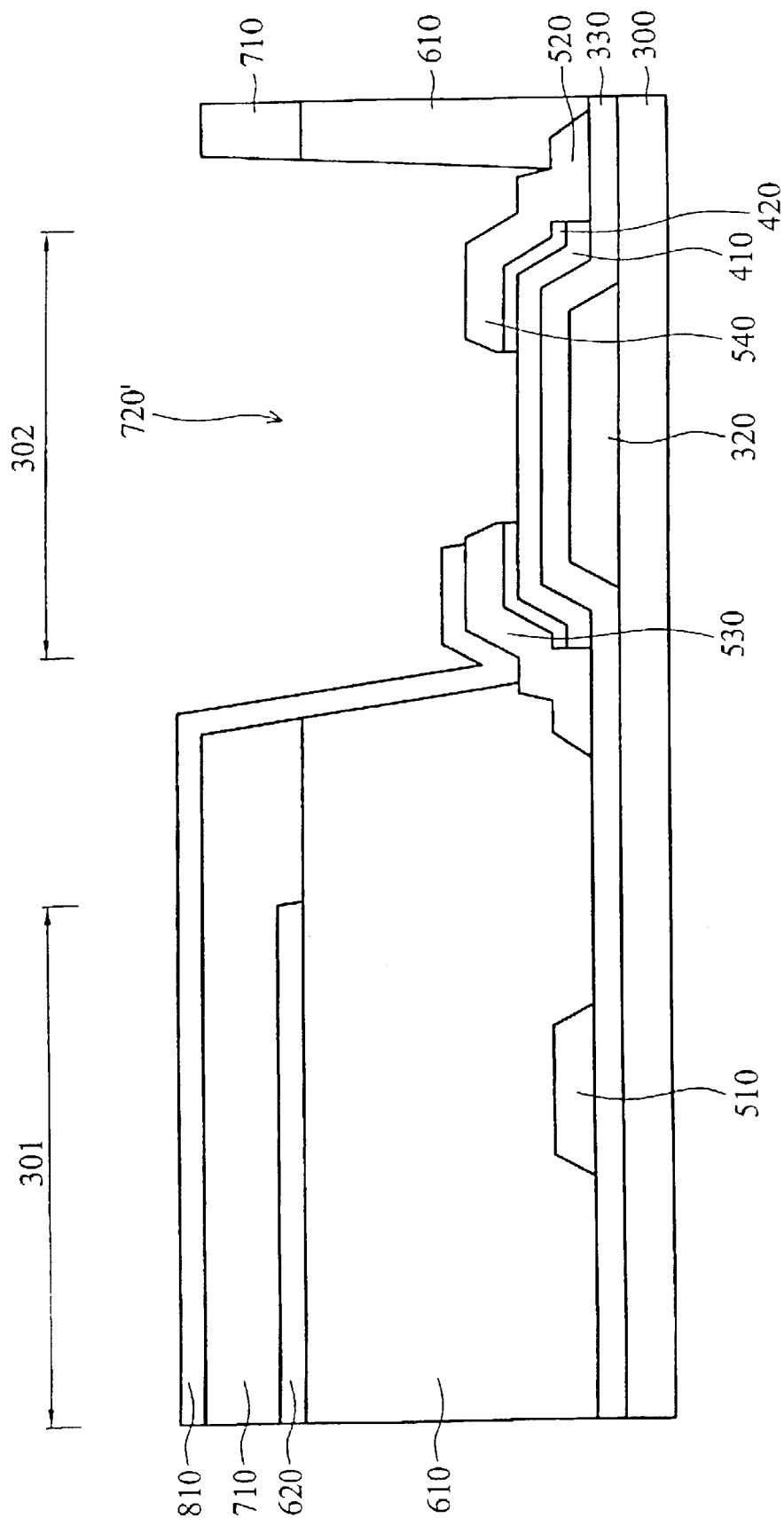
FIG. 8E is a sectional view taken along line f—f of FIG. 8D.

In FIGS. 8A, 8B, and 8C, a conformal second conductive layer (not shown) is formed on the dielectric layer 710, the interior surrounding surface of the first via hole 720, and the interior surrounding surface of the second via hole 730. The second conductive layer may be indium tin oxide (ITO) or indium zinc oxide (IZO) formed by deposition. Then, a sixth photolithography procedure using a sixth mask (PEP VI) is performed, and part of the second conductive layer is removed to form a third conductive layer 810, a fourth conductive layer 820, and an opening 830. The third conductive layer 810 is isolated from the fourth conductive layer 820 by the opening 830. The third conductive layer 810 electrically connects to the source electrode 530, and the first conductive layer 620 electrically connects to the common line 510 by the fourth conductive layer 820. The third conductive layer 810 serves as a top electrode or a charge collector electrode. Thus, a storage capacitor structure Cs composed of the first conductive layer 620, the dielectric layer 710, and the third conductive layer 810 in the capacitor area 301 is obtained.

Modification of the First Embodiment

FIG. 8D is a perspective top view according to a modification of the first embodiment of the present invention. FIG. 8E is a sectional view taken along line f–f' of FIG. 8D. Elements in FIGS. 8D and 8E repeated from FIGS. 8A–8C use the same reference numbers. Additionally, because the materials of the parts in the modification is the same as in the above first embodiment, the description of the materials is omitted.

In FIGS. 8D and 8E, a substrate 300 having a capacitor area 301 and a transistor area 302 is provided. Then, a transversely extending gate line 310 is formed on the substrate 300. The gate line 310 includes a gate electrode 320 in the transistor area 302.

Next, a gate insulation layer 330 is formed on the gate line 310, the gate electrode 320, and the substrate 300. Then, an amorphous silicon layer 410 and a doped amorphous silicon layer 420 are formed on part of the gate insulation layer 330. Thus, a semiconducting island composed of the amorphous silicon layer 410 and the doped amorphous silicon layer 420 is obtained.

Next, a longitudinally extending common line 510 and a longitudinally extending data line 520 are formed on the gate insulation layer 330, and simultaneously, a source electrode 530 and a drain electrode 540 are formed on the doped amorphous silicon layer 420. Then, using the source electrode 530 and the drain electrode 540 as a mask, part of the doped amorphous silicon layer 420 is etched to expose part of the surface of the amorphous silicon 410. Thus, a thin film transistor (TFT) structure is obtained on the gate line 310. Also, the drain electrode 540 electrically connects to the data line 520.

Next, a planarization layer 610 is formed on the gate insulation layer 330, the common line 510, the TFT structure, the data line 520, and the gate line 310. Then, a first conductive layer 620 is formed on the planarization layer 610 in the capacitor area 301. The first conductive layer 620 serves as a bottom electrode or a pixel electrode.

Next, a dielectric layer 710 is formed on the first conductive layer 620 and the planarization layer 610. The dielectric layer 710 serves as a dielectric layer of a capacitor. Then, a first via hole 720' and a second via hole 730 (shown in FIG. 8C) penetrating the dielectric layer 710 and the planarization layer 610 are formed. The first via hole 720' exposes the TFT structure including the surface of the source electrode 530, and the second via hole 730 (shown in FIG. 8C) exposes part of the surface of the first conductive layer 620 and part of the surface of the common line 510.

Next, a conformal second conductive layer (not shown) is formed on the dielectric layer 710, the interior surrounding surface of the first via hole 720', and the interior surrounding surface of the second via hole 730 (shown in FIG. 8C). Then, referring to FIGS. 8C and 8E, part of the second conductive layer is removed to form a third conductive layer 810, a fourth conductive layer 820, and an opening 830. The third conductive layer 810 is isolated from the fourth conductive layer 820 by the opening 830. The third conductive layer 810 electrically connects to the source electrode 53, and the first conductive layer 620 electrically connects to the common line 510 by the fourth conductive layer 820. The third conductive layer 810 serves as top electrode or a charge collector electrode. Thus, a storage capacitor or a charge collector electrode. Thus, a storage capacitor structure Cs composed of the first conductive layer 620, the dielectric layer 710, and the third conductive layer 810 in the capacitor area 301 is obtained.

Second Embodiment

FIGS. 9A–14A are perspective top views of an X-ray detector array element according to the second embodiment of the present invention. FIGS. 9B–14B are sectional views taken along line c–c' of FIGS. 9A–14A. FIGS. 9C–14C are sectional views taken along line e–e' of FIGS. 9A–14A. In order to simplify the illustrations, the accompanying drawings show a substrate in only one sample pixel region. That is, although only one pixel region is shown, the actual number of pixel regions may be very large.

Figure 9A:
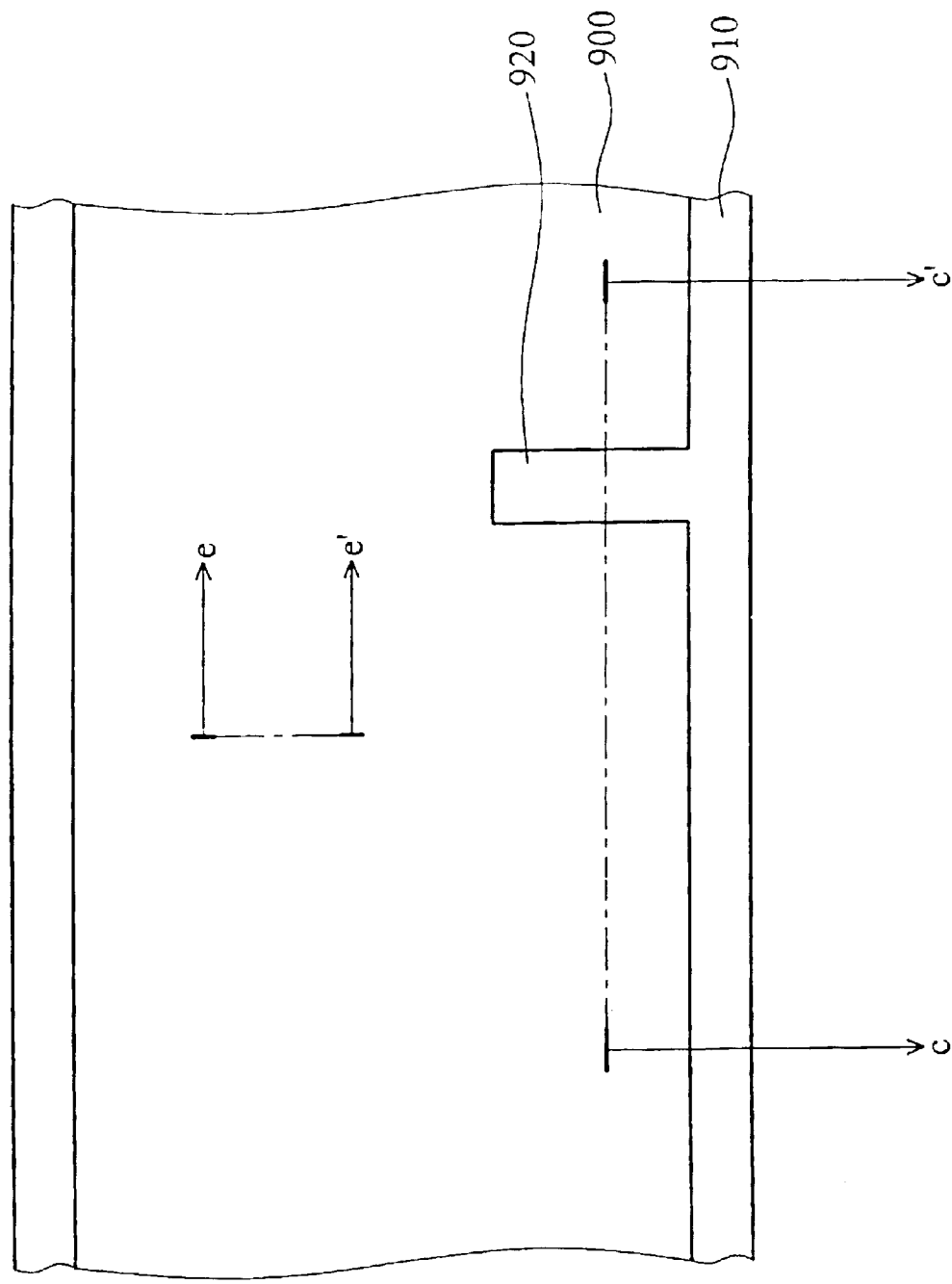
Figure 9B:
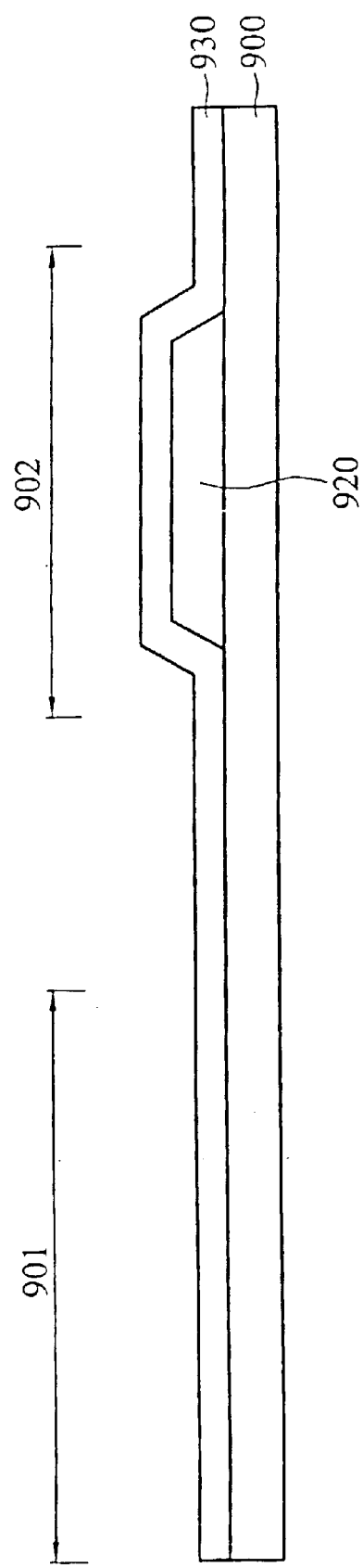
Figure 9C:
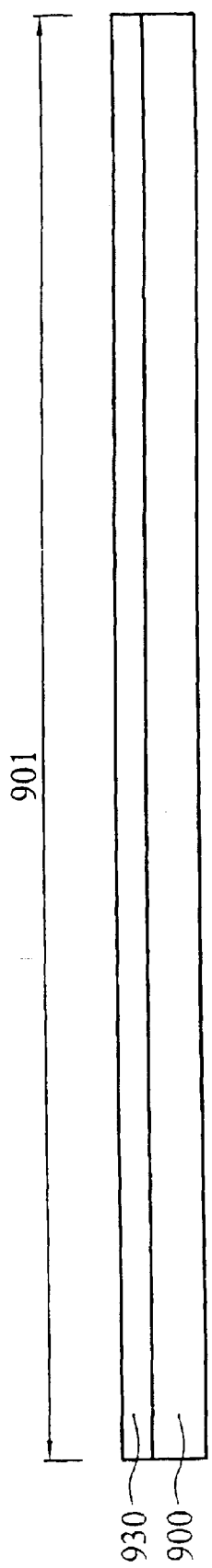

In FIGS. 9A, 9B, and 9C, a substrate 900, such as a glass substrate, having a capacitor area 901 and a transistor area 902 is provided. Then, deposition and a first photolithography procedure using a first mask (also referred to as a first photo engraving process, PEP I) are performed, and a transversely extending gate line 910 is formed on the substrate 900. The gate line 910 includes a gate electrode 920 in the transistor area 902.

It should be noted that FIG. 9A shows the gate line 910 having a protruding portion 920 in the transistor area 902, serving as the gate electrode 920. Nevertheless, the present invention is not intended to limit the position of the gate electrode. For example, the gate line 910 located in the transistor area 902 can serve as the gate electrode 920, whose illustration is similar to the modification of the first embodiment and thus is not described again here.

In FIGS. 9A, 9B, and 9C, a gate insulation layer 930 is formed on the gate line 910, the gate electrode 920, and the substrate 900. The gate line 910 and the gate electrode 920 may be metal formed by deposition. The gate insulation layer 930 may be $SiO_2$, $SiN_x$, or SiON formed by deposition.

Figure 10A:
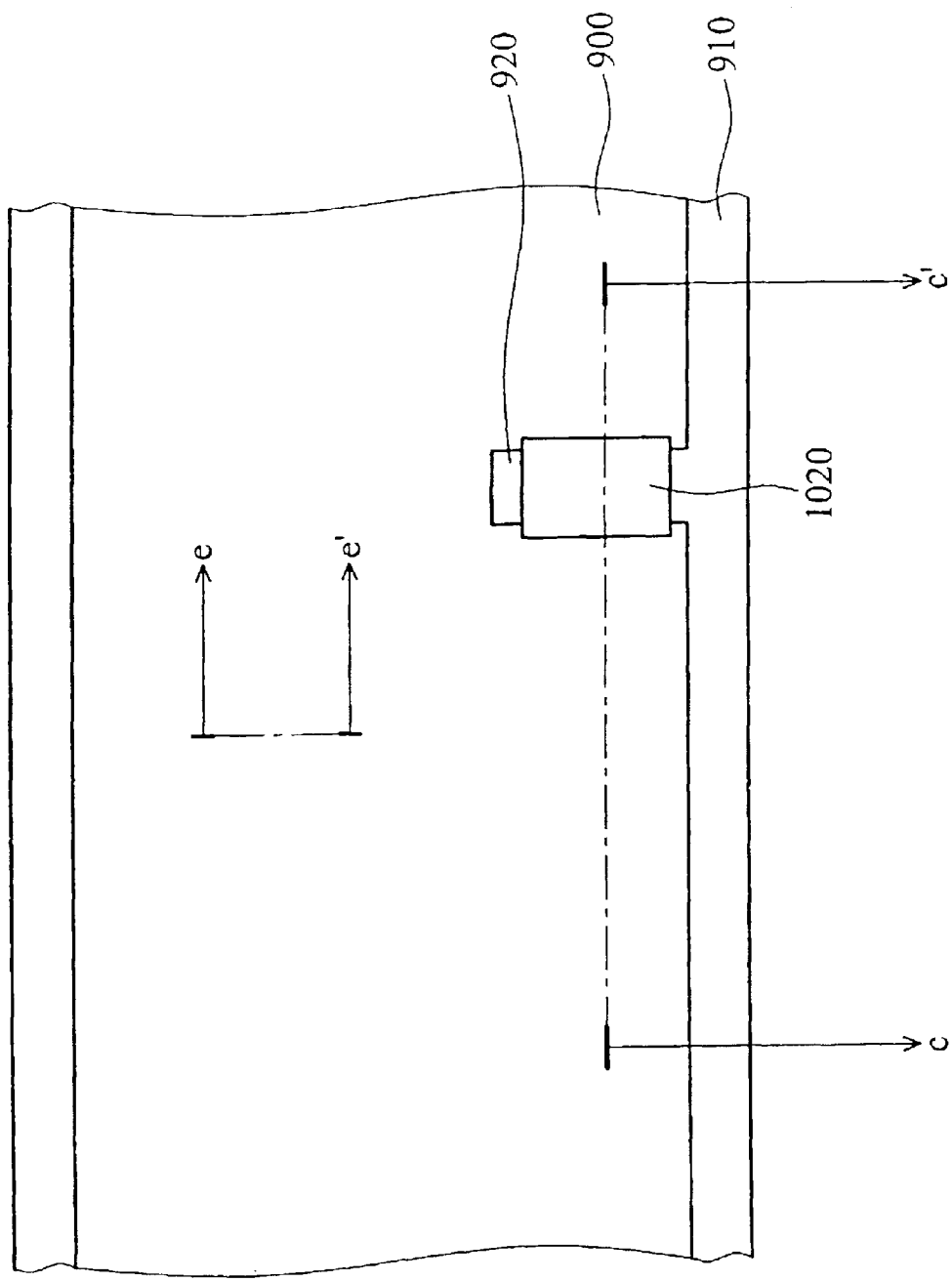
Figure 10B:
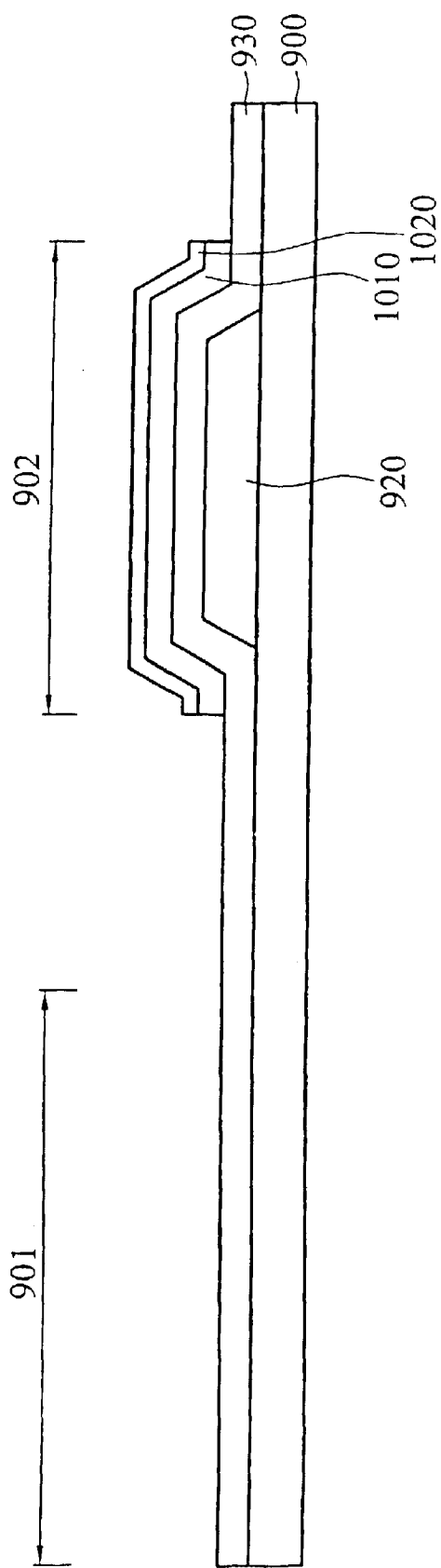
Figure 10C:
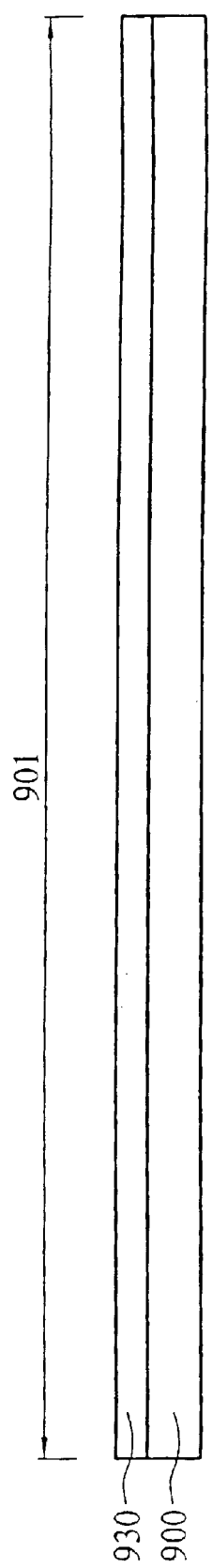

In FIGS. 10A, 10B, and 10C, an amorphous silicon layer ($\alpha$-Si layer, not shown) is deposited on the gate insulation layer 930, and then a doped amorphous silicon layer (e.g. $n^+$ $\alpha$-Si, not shown) is deposited on the amorphous silicon layer. Next, a second photolithography procedure using a second mask (PEP II) is performed, and part of the doped amorphous silicon layer and the amorphous silicon layer are etched to form a semiconducting island on the gate insulation layer 930 in the transistor area 902. The semiconducting island is composed of a patterned amorphous silicon layer 1010 and a patterned doped amorphous silicon layer 1020.

Figure 11A:
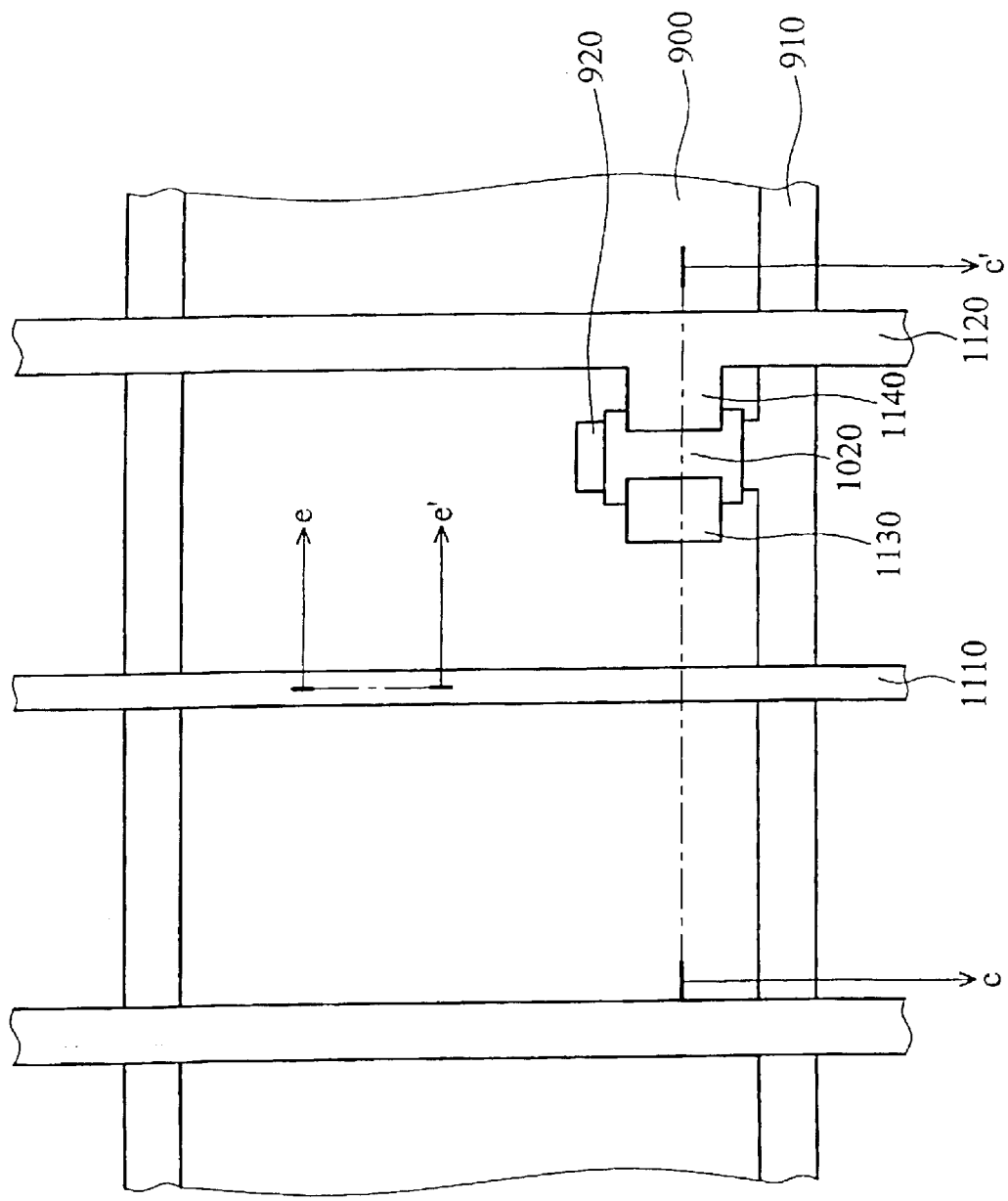
Figure 11B:
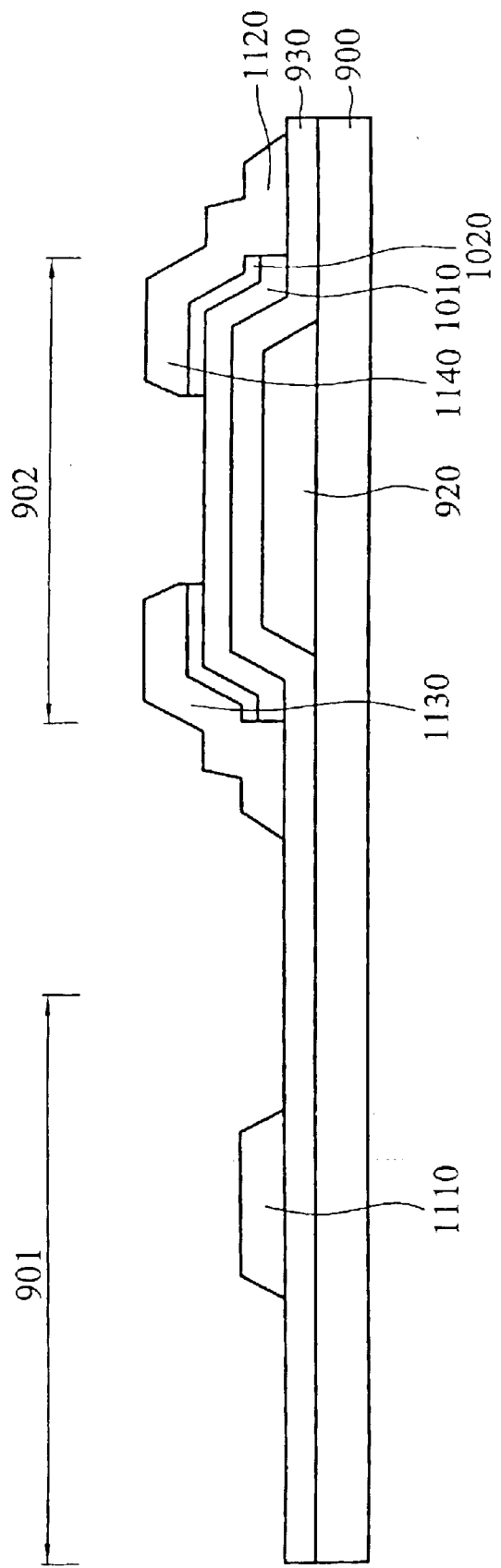
Figure 11C:
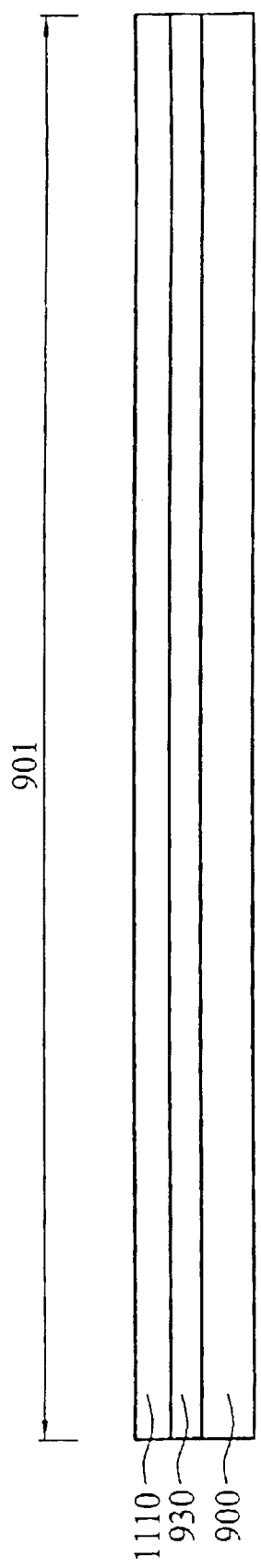

In FIGS. 11A, 11B, and 11C, a conductive layer (not shown) is deposited on the gate insulation layer 930 and the semiconducting island. Then, a third photolithography procedure using a third mask (PEP III) is performed to remove part of the conductive layer (not shown), and a longitudinally extending common line 1110 and a longitudinally extending data line 1120 are formed on the gate insulation layer 930, and simultaneously, a source electrode 1130 and a drain electrode 1140 are formed on the doped amorphous silicon layer 1020. Then, using the source electrode 1130 and the drain electrode 1140 as a mask, part of the doped amorphous silicon layer 1020 is etched to expose part of the surface of the amorphous silicon layer 1010. Thus, a thin film transistor (TFT) structure in the transistor area 902 is obtained. Also, the drain electrode 1140 electrically connects to the data line 1120.

Figure 12A:
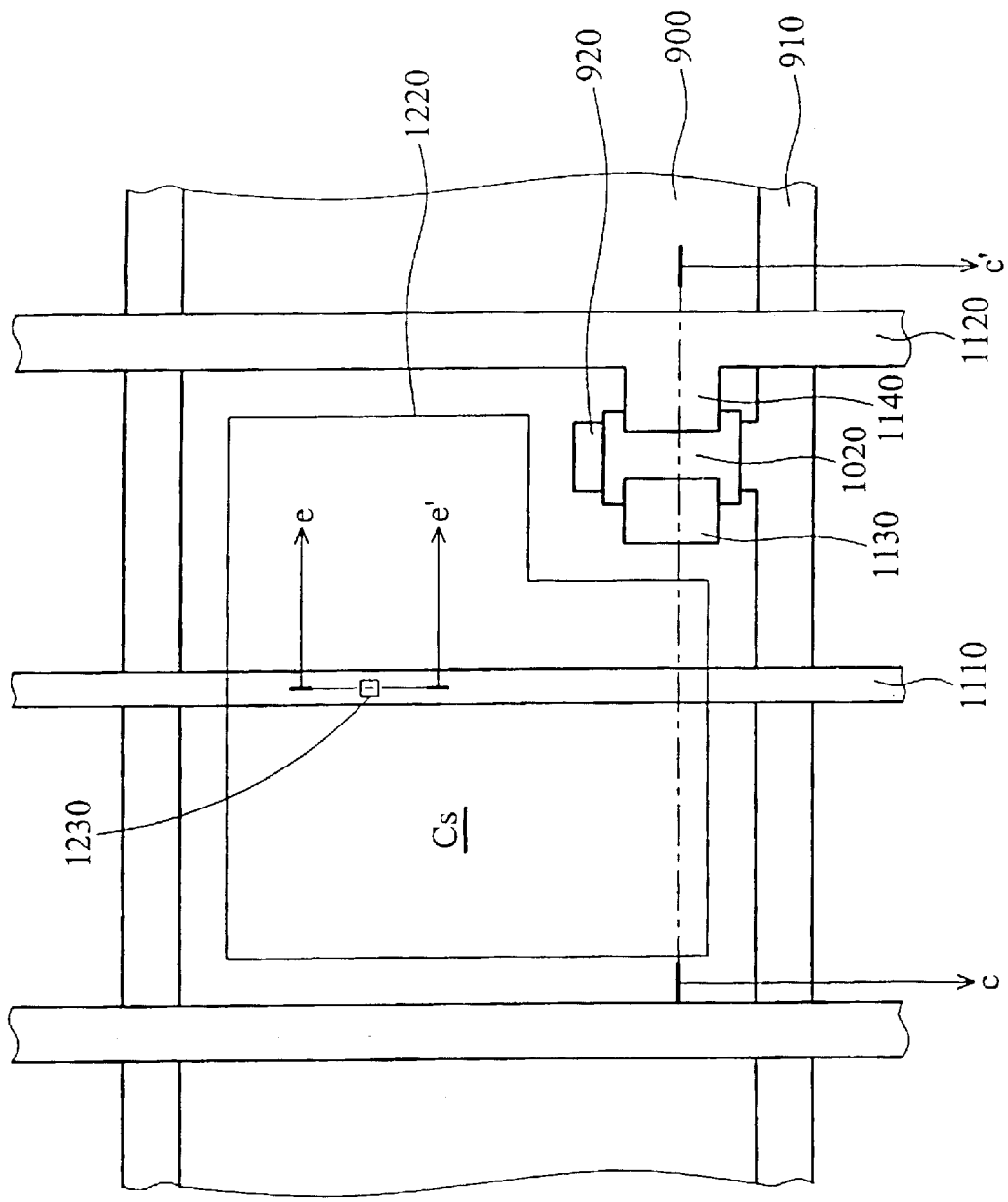
Figure 12B:
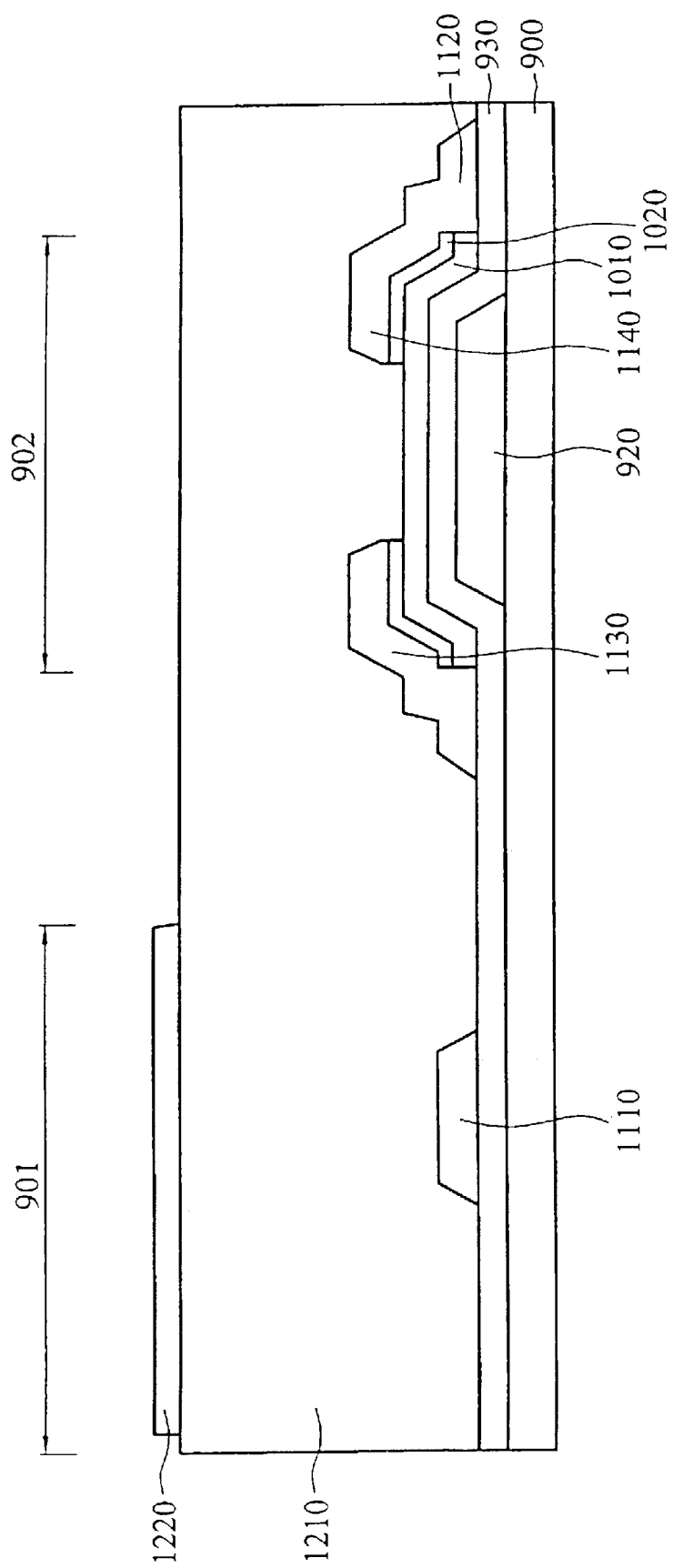
Figure 12C:
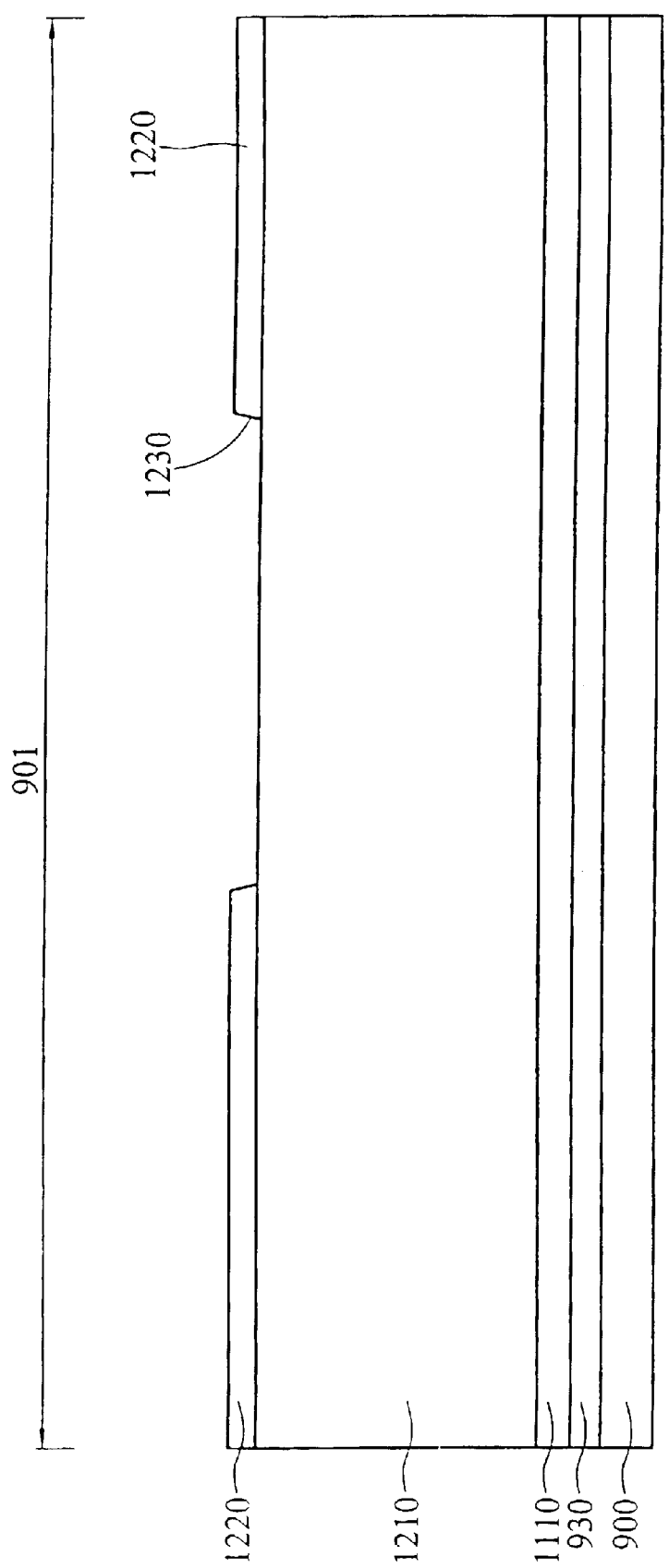

In FIGS. 12A, 12B, and 12C, a planarization layer 1210 is formed on the gate insulation layer 930, the common line 1110, the TFT structure, the data line 1120, and the gate line 910. The planarization layer 1210 may be a spin-on-glass (SOG) or organic layer by spin coating. Then, deposition and a fourth photolithography procedure using a fourth mask (PEP IV) are performed, and a first conductive layer 1220 having a first opening 1230 is formed on the planarization layer 1210 in the capacitor area 901. The first conductive layer 1220 may be indium tin oxide (ITO) or indium zinc oxide (IZO) formed by deposition, serving as a bottom electrode or a pixel electrode. The first opening 1230 exposes part of the planarization layer 1210 above the common line 1110.

Figure 13A:
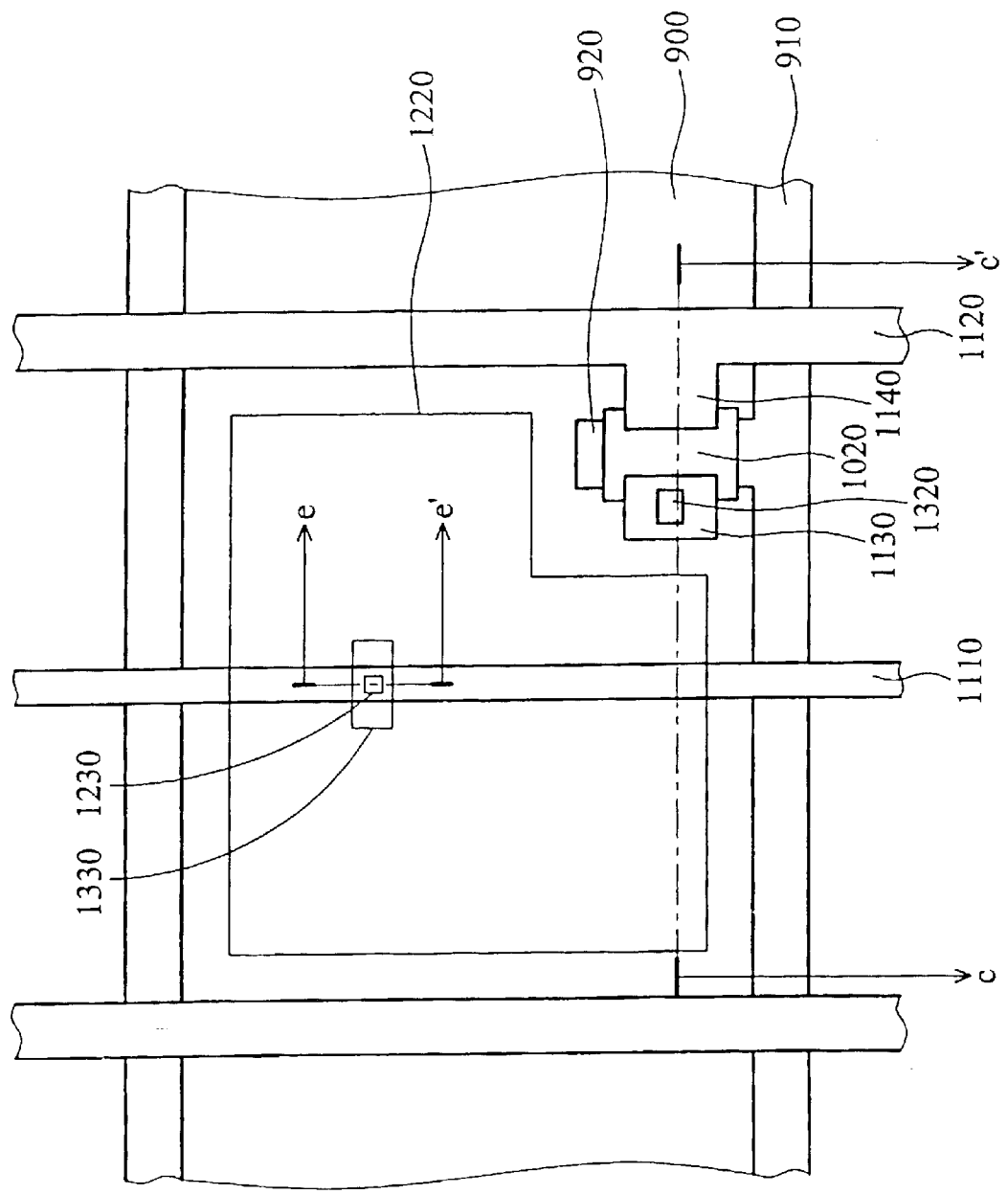
Figure 13B:
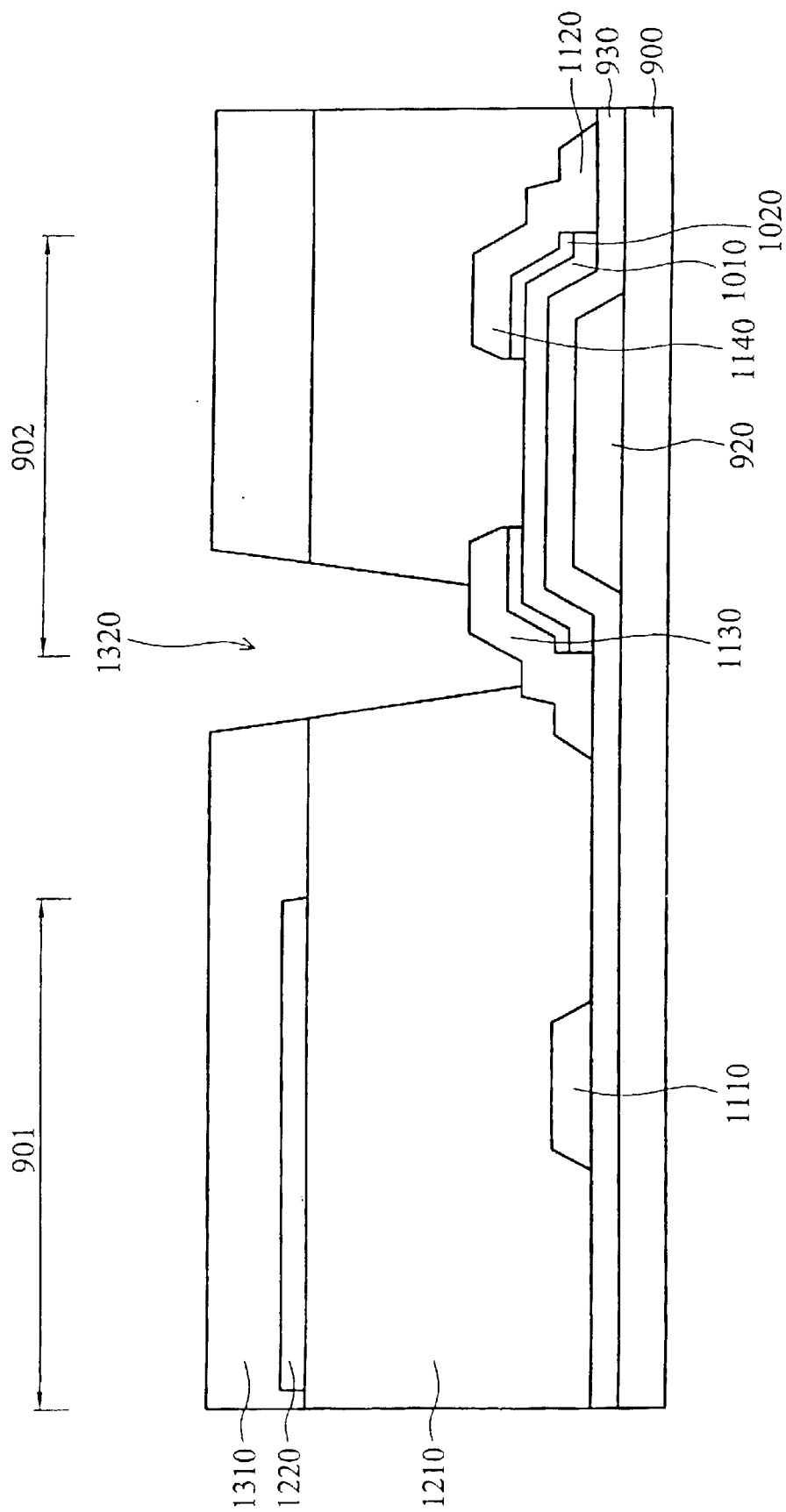
Figure 13C:
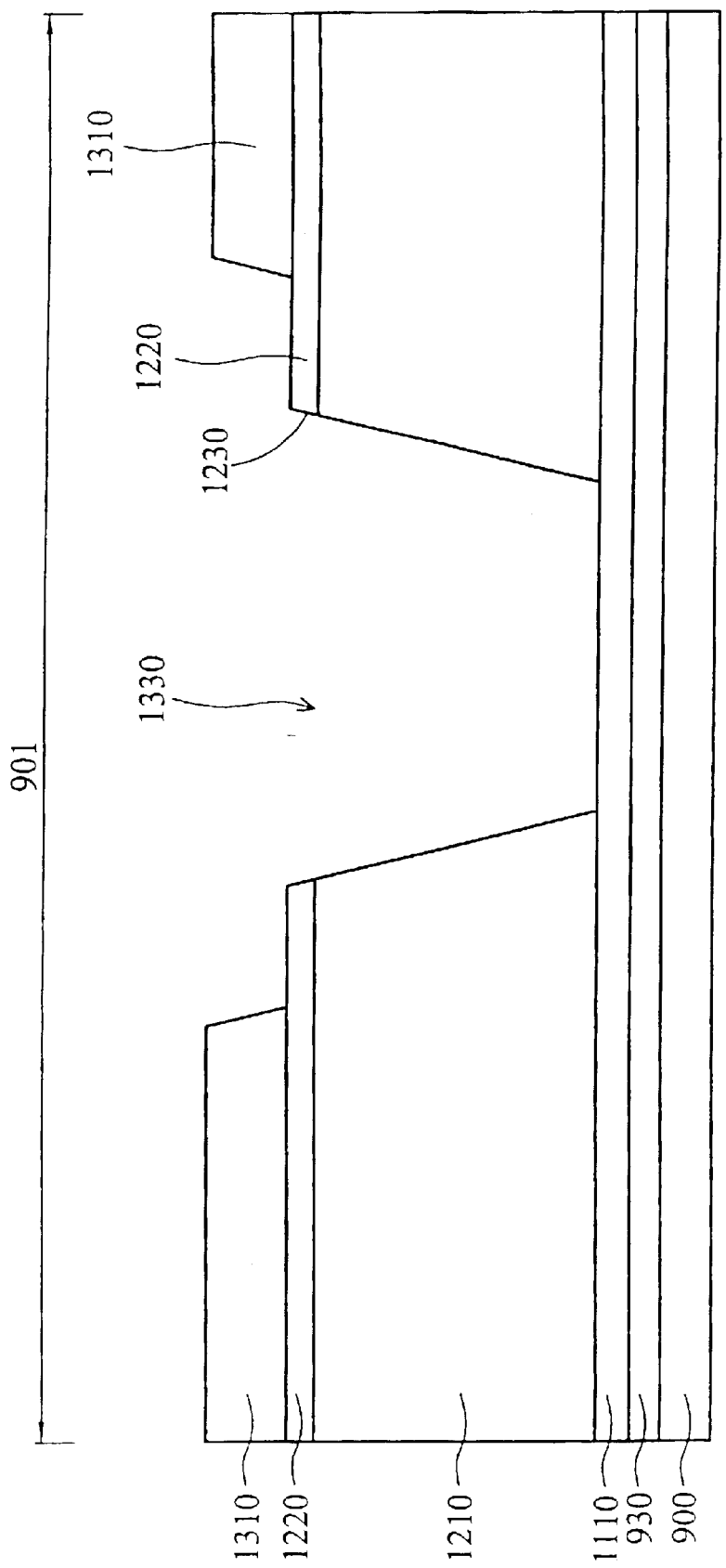

In FIGS. 13A, 13B, and 13C, a dielectric layer 1310 is formed on the first conductive layer 1220 and the planarization layer 1210. The dielectric layer 1310 can be $SiN_x$, SiON, or $SiO_x$ formed by deposition, serving as a dielectric layer of a capacitor. Then, a fourth photolithography procedure using a fourth mask (PEP IV) is performed, and a first via hole 1320 and a second via hole 1330 penetrating the dielectric layer 1310 and the planarization layer 1210 are formed. The first via hole 1320 exposes the surface of the source electrode 1130, and the second via hole 1330 exposes part of the surface of the first conductive layer 1220 and part of the surface of the common line 1110. Also, the second via hole 1330 and the first opening 1230 overlap (regarding the opening area).

Figure 14A:
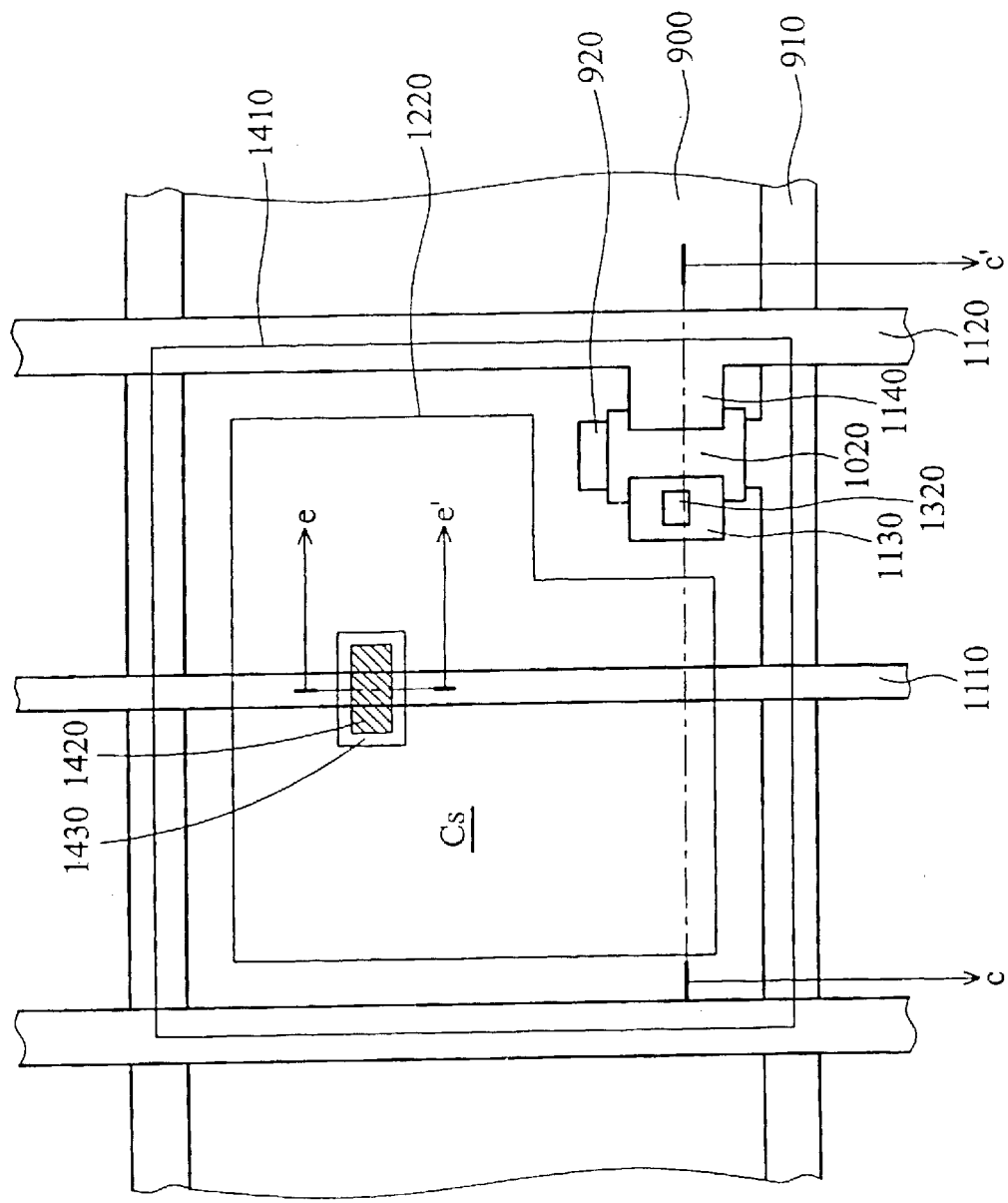
Figure 14B:
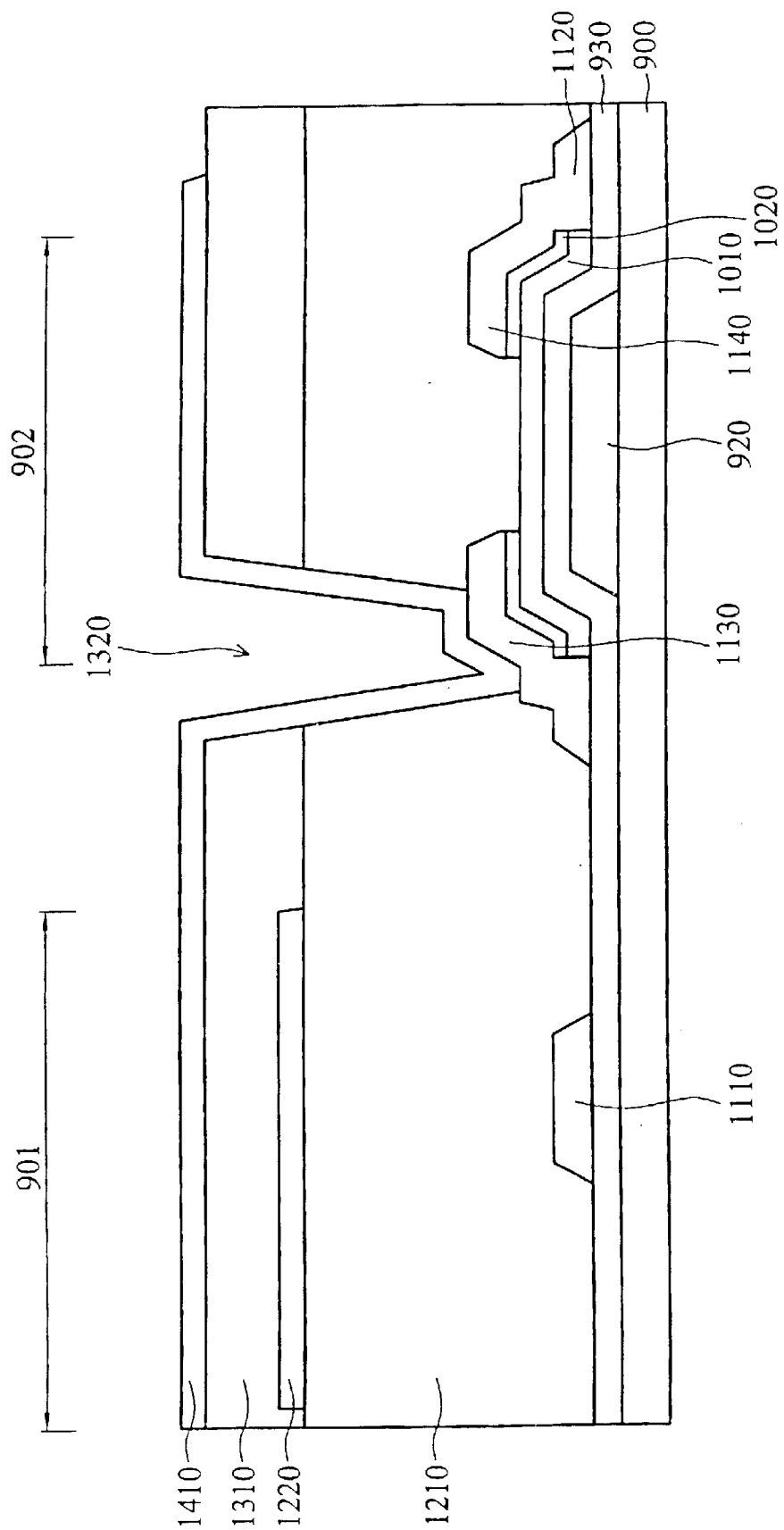
Figure 14C:
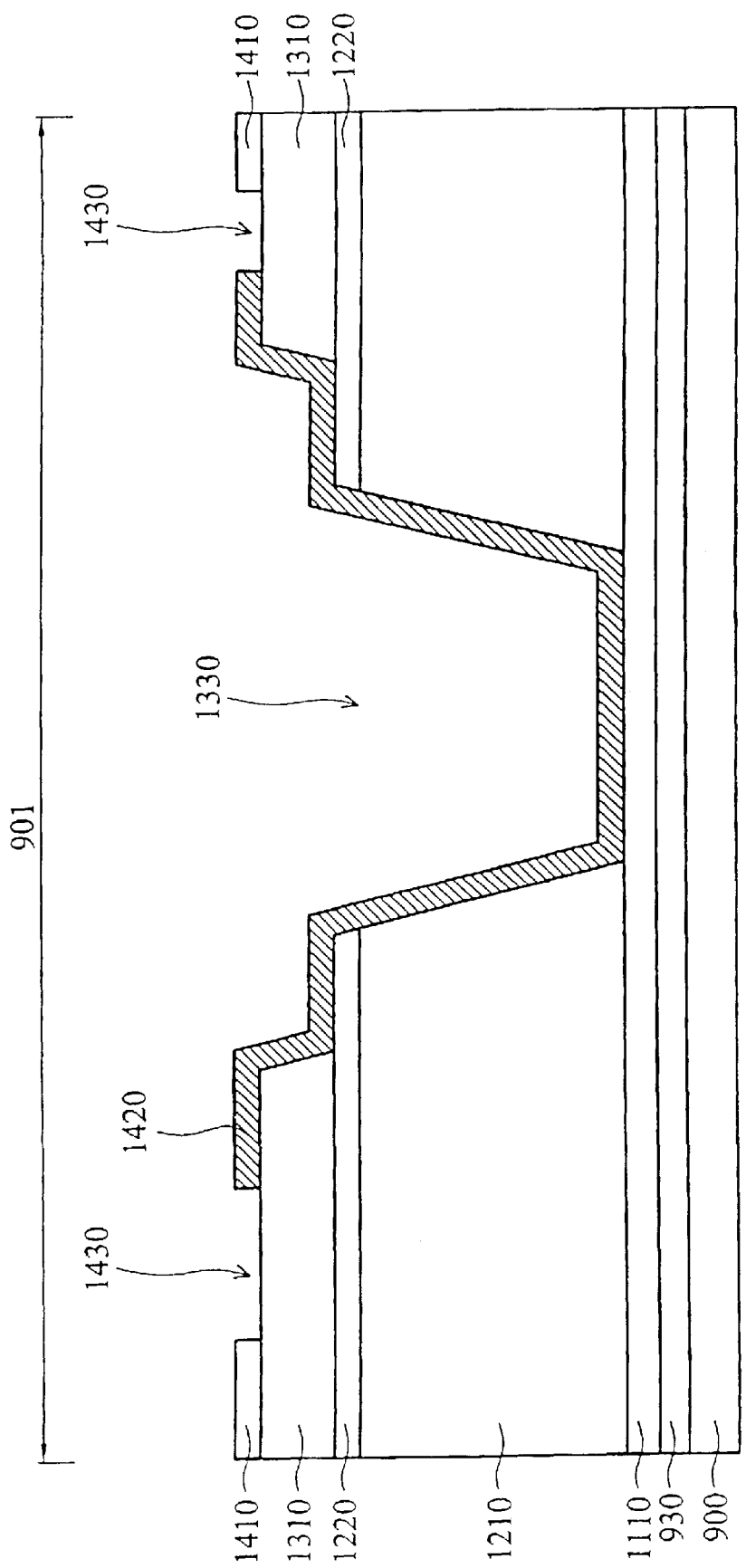

In FIGS. 14A, 14B, and 14C, a conformal second conductive layer (not shown) is formed on the dielectric layer 1310, the interior surrounding surface of the first via hole 1320, and the interior surrounding surface of the second via hole 1330. The second conductive layer may be indium tin oxide (ITO) or indium zinc oxide (IZO) formed by deposition. Then, a sixth photolithography procedure using a sixth reticle (PEP VI) is performed, and part of the second conductive layer is removed to form a third conductive layer 1410, a fourth conductive layer 1420, and a second opening 1430. The third conductive layer 1410 is isolated from the fourth conductive layer 1420 by the second opening 1430. The third conductive layer 1410 electrically connects to the source electrode 1130, and the first conductive layer 1220 electrically connects to the common line 1110 by the fourth conductive layer 1420. The third conductive layer 1410 serves as a top electrode or a charge collector electrode. Thus, a storage capacitor structure Cs composed of the first conductive layer 1220, the dielectric layer 1310, and the third conductive layer 1410 in the capacitor area 901 is obtained.

In comparison with the background art, the present invention only uses six masks to form the X-ray detector array, thereby decreasing costs.

Finally, while the present invention has been described by way of example and in terms of the above, it is to be understood that the invention is not limited to the disclosed embodiments. On the contrary, the present invention covers various modifications and similar arrangements as would be apparent to those skilled in the art. Therefore, the scope of the appended claims should be accorded the broadest interpretation to encompass all such modifications and similar arrangements.

What is claimed is:

1. A method of fabricating an X-ray detector array, comprising:

providing a substrate having a capacitor area and a transistor area;

forming a gate line extending transversely on the substrate, wherein the gate line includes a gate electrode in the transistor area;

forming a gate insulation layer on the gate line, the gate electrode, and the substrate;

forming a semiconducting island on the gate insulation layer in the transistor area;

forming a common line and a data line extending longitudinally on the gate insulation layer, and forming a source electrode and a drain electrode on the semiconducting island to form a thin film transistor (TFT) structure, wherein the drain electrode electrically connects to the data line;

forming a planarization layer on the gate insulation layer, the common line, the TFT structure, the data line, and the gate line;

forming a first conductive layer on the planarization layer in the capacitor area;

forming a dielectric layer on the first conductive layer and the planarization layer;

forming a first via hole and a second via hole penetrating the dielectric layer and the planarization layer, wherein the first via hole exposes a surface of the source electrode, and the second via hole exposes part of a surface of the first conductive layer and part of a surface of the common line;

forming a conformal second conductive layer on the dielectric layer, an interior surrounding surface of the first via hole, and an interior surrounding surface of the second via hole; and removing part of the second conductive layer to form a third conductive layer, a fourth conductive layer, and a first opening, wherein the third conductive layer is isolated from the fourth conductive layer by the first opening;

wherein the third conductive layer electrically connects to the source electrode;

wherein the first conductive layer electrically connects to the common line by the fourth conductive layer; and wherein a storage capacitor structure is composed of the first conductive layer, the dielectric layer, and the third conductive layer in the capacitor area.

2. The method according to claim 1, wherein the gate line is metal.

3. The method according to claim 1, wherein the gate insulation layer comprises one of $SiO_2$, $SiN_x$, and SiON.

4. The method according to claim 1, wherein the forming of the semiconducting island comprises:

forming an amorphous silicon layer on the gate insulation layer;

forming a doped amorphous silicon layer on the amorphous silicon layer; and removing part of the doped amorphous silicon layer and the amorphous silicon layer to form the semiconducting island in the transistor area.

5. The method according to claim 4, further comprising, after forming the common line, the data line, and the TFT structure:

using the source electrode and drain electrode as a mask, and removing part of the doped amorphous silicon layer to expose a surface of the amorphous silicon layer.

6. The method according to claim 1, wherein the common line, the data line, the source electrode, and the drain electrode are simultaneously defined by photolithography.

7. The method according to claim 1, wherein the planarization layer is one of a spin-on-glass (SOG) and organic layer.

8. The method according to claim 1, wherein the first conductive layer comprises one of indium tin oxide (ITO) and indium zinc oxide (IZO), serving as one of a bottom electrode and a pixel electrode.

9. The method according to claim 1, wherein the dielectric layer comprises one of $SiO_2$, $SiN_x$, and SiON.

10. The method according to claim 1, wherein the second conductive layer comprises one of indium tin oxide (ITO) and indium zinc oxide (IZO), serving as one of a top electrode and a charge collector electrode.

11. The method according to claim 1, wherein the gate line has a protruding portion in the transistor area, serving as the gate electrode.

12. The method according to claim 1, wherein the gate line located in the transistor area serves as the gate electrode.

13. The method according to claim 1, further comprising, in the forming of the first conductive layer:

simultaneously forming a second opening in the first conductive layer, wherein the second opening exposes the planarization layer above the common line.

14. The method according to claim 13, wherein the second via hole and the second opening overlap.

15. A method of fabricating an X-ray detector array, comprising:

providing a substrate having a capacitor area and a transistor area;

forming a gate line extending transversely on the substrate, wherein the gate line includes a gate electrode in the transistor area;

forming a gate insulation layer on the gate line, the gate electrode, and the substrate;

forming a semiconducting island on the gate insulation layer in the transistor area;

forming a common line and a data line extending longitudinally on the gate insulation layer, and forming a source electrode and a drain electrode on the semiconductor island to form a thin film transistor (TFT) structure, wherein the drain electrode electrically connects to the data line;

forming a planarization layer on the gate insulation layer, the common line, the TFT structure, the data line, and the gate line;

forming a first conductive layer on the planarization layer in the capacitor area, wherein the first conductive layer has a first opening to expose the planarization layer above the common line;

forming a dielectric layer on the first conductive layer and the planarization layer;

forming a first via hole and a second via hole penetrating the dielectric layer and the planarization layer, wherein the first via hole exposes a surface of the source electrode, the second via hole exposes part of a surface of the first conductive layer and part of a surface of the common line, and the second via hole and the first opening have an overlap;

forming a conformal second conductive layer on the dielectric layer, an interior surrounding surface of the first via hole, and an interior surrounding surface of the second via hole; and removing part of the second conductive layer to form a third conductive layer, a fourth conductive layer, and a second opening, wherein the third conductive layer is isolated from the fourth conductive layer by the second opening;

wherein the third conductive layer electrically connects to the source electrode;

wherein the first conductive layer electrically connects to the common line by the fourth conductive layer; and wherein a storage capacitor structure is composed of the first conductive layer, the dielectric layer, and the third conductive layer in the capacitor area.

16. The method according to claim 15, wherein the forming of the semiconducting island comprises:

forming an amorphous silicon layer on the gate insulation layer;

forming a doped amorphous silicon layer on the amorphous silicon layer; and removing part of the doped amorphous silicon layer and the amorphous silicon layer to form the semiconducting island in the transistor area.

17. The method according to claim 16, further comprising, after the forming of the common line, the data line, and the TFT structure:

using the source electrode and drain electrode as a mask, and removing part of the doped amorphous silicon layer to expose a surface of the amorphous silicon layer.

18. The method according to claim 15, wherein the gate line has a protruding portion in the transistor area, serving as the gate electrode.

19. The method according to claim 15, wherein the gate line located in the transistor area serves as the gate electrode.

20. A method of fabricating an X-ray detector array, used to decrease consumption of masks during photolithography, comprising:

providing a substrate having a capacitor area and a transistor area;

using a first mask to form a gate line transversely extending on the substrate by photolithography, wherein the gate line includes a gate electrode in the transistor area;

forming a gate insulation layer on the gate line, the gate electrode, and the substrate;

using a second mask to form a semiconducting island on the gate insulation layer in the transistor area by photolithography;

using a third mask to form a common line and a data line longitudinally extending on the gate insulation layer by photolithography, and forming a source electrode and a drain electrode on the semiconducting island to form a thin film transistor (TFT) structure, wherein the drain electrode electrically connects to the data line;

forming a planarization layer on the gate insulation layer, the common line, the TFT structure, the data line, and the gate line;

using a fourth mask to form a first conductive layer on the planarization layer in the capacitor area by photolithography;

forming a dielectric layer on the first conductive layer and the planarization layer;

using a fifth mask to form a first via hole and a second via hole penetrating the dielectric layer and the planarization layer by photolithography, wherein the first via hole exposes a surface of the source electrode, and the second via hole exposes part of a surface of the first conductive layer and part of a surface of the common line;

forming a conformal second conductive layer on the dielectric layer, an interior surrounding surface of the first via hole, and an interior surrounding surface of the second via hole; and using a sixth mask to remove part of the second conductive layer to form a third conductive layer, a fourth conductive layer, and a first opening by photolithography, wherein the third conductive layer is isolated from the fourth conductive layer by the first opening;

wherein the third conductive layer electrically connects to the source electrode;

wherein the first conductive layer electrically connects to the common line by the fourth conductive layer; and wherein a storage capacitor structure is composed of the first conductive layer, the dielectric layer, and the third conductive layer in the capacitor area.

* * * * *